US009236297B2

(12) United States Patent
Chen et al.

(10) Patent No.: US 9,236,297 B2
(45) Date of Patent: Jan. 12, 2016

(54) LOW TEMPATURE TUNGSTEN FILM DEPOSITION FOR SMALL CRITICAL DIMENSION CONTACTS AND INTERCONNECTS

(71) Applicant: Novellus Systems, Inc., Fremont, CA (US)

(72) Inventors: Feng Chen, Milpitas, CA (US); Raashina Humayun, Fremont, CA (US); Michal Danek, Cupertino, CA (US); Anand Chandrashekar, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 14/097,160

(22) Filed: Dec. 4, 2013

(65) Prior Publication Data
US 2014/0162451 A1    Jun. 12, 2014

Related U.S. Application Data

(63) Continuation of application No. 12/755,259, filed on Apr. 6, 2010, now Pat. No. 8,623,733.

(60) Provisional application No. 61/169,954, filed on Apr. 16, 2009.

(51) Int. Cl.
*H01L 21/4763* (2006.01)
*H01L 21/768* (2006.01)
(Continued)

(52) U.S. Cl.
CPC ...... *H01L 21/76879* (2013.01); *C23C 16/0272* (2013.01); *C23C 16/045* (2013.01);
(Continued)

(58) Field of Classification Search
USPC ................... 438/680; 118/719; 257/E21.295
See application file for complete search history.

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

| EP | 0 437 110 | 7/1991 |
| EP | 1 156 132 | 11/2001 |

(Continued)

OTHER PUBLICATIONS

US Office Action, dated Apr. 7, 2014, issued in U.S. Appl. No. 13/633,502.

(Continued)

*Primary Examiner* — Caleb Henry
(74) *Attorney, Agent, or Firm* — Weaver Austin Villeneuve & Sampson LLP

(57) ABSTRACT

Provided are methods of void-free tungsten fill of high aspect ratio features. According to various embodiments, the methods involve a reduced temperature chemical vapor deposition (CVD) process to fill the features with tungsten. In certain embodiments, the process temperature is maintained at less than about 350° C. during the chemical vapor deposition to fill the feature. The reduced-temperature CVD tungsten fill provides improved tungsten fill in high aspect ratio features, provides improved barriers to fluorine migration into underlying layers, while achieving similar thin film resistivity as standard CVD fill. Also provided are methods of depositing thin tungsten films having low-resistivity. According to various embodiments, the methods involve performing a reduced temperature low resistivity treatment on a deposited nucleation layer prior to depositing a tungsten bulk layer and/or depositing a bulk layer via a reduced temperature CVD process followed by a high temperature CVD process.

17 Claims, 21 Drawing Sheets

(51) Int. Cl.

| | |
|---|---|
| C23C 16/02 | (2006.01) |
| C23C 16/04 | (2006.01) |
| C23C 16/14 | (2006.01) |
| C23C 16/455 | (2006.01) |
| H01L 21/285 | (2006.01) |
| H01L 21/67 | (2006.01) |

(52) U.S. Cl.
CPC .......... *C23C 16/14* (2013.01); *C23C 16/45523* (2013.01); *H01L 21/28556* (2013.01); *H01L 21/67017* (2013.01); *H01L 21/76843* (2013.01); *H01L 21/76876* (2013.01); *H01L 21/76877* (2013.01)

(56) References Cited

U.S. PATENT DOCUMENTS

| | | | |
|---|---|---|---|
| 4,874,719 A | 10/1989 | Kurosawa | |
| 4,962,063 A | 10/1990 | Maydan et al. | |
| 5,028,565 A * | 7/1991 | Chang et al. | 438/654 |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A * | 7/1994 | Petro et al. | 438/685 |
| 5,370,739 A | 12/1994 | Foster et al. | |
| 5,391,394 A | 2/1995 | Hansen | |
| 5,567,583 A | 10/1996 | Wang et al. | |
| 5,661,080 A * | 8/1997 | Hwang et al. | 438/654 |
| 5,726,096 A | 3/1998 | Jung | |
| 5,795,824 A * | 8/1998 | Hancock | 438/656 |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,926,720 A | 7/1999 | Zhao et al. | |
| 5,956,609 A * | 9/1999 | Lee et al. | 438/627 |
| 5,963,833 A | 10/1999 | Thakur | |
| 5,994,749 A | 11/1999 | Oda | |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A * | 5/2000 | Berenbaum et al. | 438/648 |
| 6,099,904 A * | 8/2000 | Mak et al. | 427/253 |
| 6,107,200 A * | 8/2000 | Takagi et al. | 438/685 |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 * | 9/2001 | Gould-Choquette et al. | 438/680 |
| 6,297,152 B1 | 10/2001 | Itoh et al. | |
| 6,306,211 B1 | 10/2001 | Takahashi et al. | |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,404,054 B1 | 6/2002 | Oh et al. | |
| 6,429,126 B1 * | 8/2002 | Herner et al. | 438/680 |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,627,066 B1 | 9/2003 | Isayama et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,221 B2 | 5/2004 | Cheung et al. | |
| 6,740,585 B2 | 5/2004 | Yoon et al. | |
| 6,777,331 B2 * | 8/2004 | Nguyen | 438/687 |
| 6,797,340 B2 | 9/2004 | Fang et al. | |
| 6,827,839 B2 | 12/2004 | Sonnenberg et al. | |
| 6,844,258 B1 | 1/2005 | Fair et al. | |
| 6,861,356 B2 * | 3/2005 | Matsuse et al. | 438/653 |
| 6,902,763 B1 | 6/2005 | Elers et al. | |
| 6,903,016 B2 * | 6/2005 | Cohen | 438/687 |
| 6,905,543 B1 | 6/2005 | Fair et al. | |
| 6,908,848 B2 * | 6/2005 | Koo | 438/627 |
| 6,936,538 B2 | 8/2005 | Byun | |
| 6,939,804 B2 * | 9/2005 | Lai et al. | 438/680 |
| 6,962,873 B1 | 11/2005 | Park | |
| 7,005,372 B2 * | 2/2006 | Levy et al. | 438/627 |
| 7,141,494 B2 | 11/2006 | Lee et al. | |
| 7,144,488 B2 | 12/2006 | Binstead et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 * | 6/2007 | Kori et al. | 438/685 |
| 7,262,125 B2 | 8/2007 | Wongsenakhum et al. | |
| 7,355,254 B2 | 4/2008 | Datta et al. | |
| 7,416,979 B2 | 8/2008 | Yoon et al. | |
| 7,419,904 B2 * | 9/2008 | Kato | 438/627 |
| 7,429,402 B2 | 9/2008 | Gandikota et al. | |
| 7,465,665 B2 * | 12/2008 | Xi et al. | 438/685 |
| 7,465,666 B2 * | 12/2008 | Kori et al. | 438/685 |
| 7,501,343 B2 * | 3/2009 | Byun et al. | 438/680 |
| 7,501,344 B2 * | 3/2009 | Byun et al. | 438/680 |
| 7,563,718 B2 * | 7/2009 | Kim | 438/693 |
| 7,589,017 B2 * | 9/2009 | Chan et al. | 438/648 |
| 7,595,263 B2 | 9/2009 | Chung et al. | |
| 7,605,083 B2 * | 10/2009 | Lai et al. | 438/680 |
| 7,611,990 B2 * | 11/2009 | Yoon et al. | 438/680 |
| 7,655,567 B1 * | 2/2010 | Gao et al. | 438/685 |
| 7,674,715 B2 * | 3/2010 | Kori et al. | 438/685 |
| 7,675,119 B2 | 3/2010 | Taguwa | |
| 7,691,749 B2 | 4/2010 | Levy et al. | |
| 7,695,563 B2 * | 4/2010 | Lu et al. | 117/89 |
| 7,709,385 B2 * | 5/2010 | Xi et al. | 438/680 |
| 7,732,327 B2 * | 6/2010 | Lee et al. | 438/649 |
| 7,745,329 B2 * | 6/2010 | Wang et al. | 438/648 |
| 7,745,333 B2 * | 6/2010 | Lai et al. | 438/680 |
| 7,749,815 B2 * | 7/2010 | Byun | 438/126 |
| 7,754,604 B2 * | 7/2010 | Wongsenakhum et al. | 438/656 |
| 7,772,114 B2 * | 8/2010 | Chan et al. | 438/656 |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 8,623,733 B2 | 1/2014 | Chen et al. | |
| 8,709,948 B2 | 4/2014 | Danek et al. | |
| 8,853,080 B2 | 10/2014 | Guan et al. | |
| 8,975,184 B2 | 3/2015 | Chen et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0037630 A1 * | 3/2002 | Agarwal et al. | 438/430 |
| 2002/0090796 A1 | 7/2002 | Desai et al. | |
| 2002/0117399 A1 * | 8/2002 | Chen et al. | 205/125 |
| 2002/0132472 A1 | 9/2002 | Park | |
| 2002/0155722 A1 * | 10/2002 | Satta et al. | 438/704 |
| 2002/0168840 A1 | 11/2002 | Hong et al. | |
| 2002/0177316 A1 | 11/2002 | Miller et al. | |
| 2003/0059980 A1 * | 3/2003 | Chen et al. | 438/118 |
| 2003/0091870 A1 | 5/2003 | Bhowmik et al. | |
| 2003/0104126 A1 | 6/2003 | Fang et al. | |

(56) References Cited

U.S. PATENT DOCUMENTS

| | | |
|---|---|---|
| 2003/0123216 A1 | 7/2003 | Yoon et al. |
| 2003/0127043 A1 | 7/2003 | Lu et al. |
| 2003/0129828 A1* | 7/2003 | Cohen ................... 438/629 |
| 2003/0190802 A1 | 10/2003 | Wang et al. |
| 2004/0014315 A1 | 1/2004 | Lai et al. |
| 2004/0044127 A1 | 3/2004 | Okubo et al. |
| 2004/0142557 A1* | 7/2004 | Levy et al. .................. 438/680 |
| 2004/0151845 A1 | 8/2004 | Nguyen et al. |
| 2004/0202786 A1* | 10/2004 | Wongsenakhum et al. ... 427/250 |
| 2004/0206267 A1 | 10/2004 | Sambasivan et al. |
| 2005/0031786 A1* | 2/2005 | Lee et al. ................. 427/255.28 |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 | 9/2005 | Matsuse et al. |
| 2006/0003581 A1 | 1/2006 | Johnston et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1 | 4/2007 | Kwak et al. |
| 2007/0099420 A1 | 5/2007 | Dominquez et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1* | 10/2008 | Chan et al. ................... 438/685 |
| 2008/0280438 A1 | 11/2008 | Lai et al. |
| 2009/0045517 A1 | 2/2009 | Sugiura et al. |
| 2009/0053893 A1 | 2/2009 | Khandelwal et al. |
| 2009/0057151 A1 | 3/2009 | Shalyt et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0035427 A1 | 2/2010 | Chan et al. |
| 2010/0055904 A1* | 3/2010 | Chen et al. ................... 438/680 |
| 2010/0130002 A1 | 5/2010 | Dao et al. |
| 2010/0130003 A1 | 5/2010 | Lin et al. |
| 2010/0155846 A1 | 6/2010 | Mukherjee et al. |
| 2010/0159694 A1* | 6/2010 | Chandrashekar et al. .... 438/660 |
| 2010/0244141 A1 | 9/2010 | Beyer et al. |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0199887 A1 | 8/2012 | Chan et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0161203 A1 | 6/2013 | Mayer |
| 2013/0168864 A1 | 7/2013 | Lee et al. |
| 2013/0171822 A1 | 7/2013 | Chandrashekar et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0308812 A1 | 10/2014 | Arghavani et al. |
| 2015/0056803 A1 | 2/2015 | Chandrashekar et al. |

FOREIGN PATENT DOCUMENTS

| | | |
|---|---|---|
| EP | 1 179 838 | 2/2002 |
| JP | 08-115984 | 5/1996 |
| JP | 09-027596 | 1/1997 |
| JP | H10-144688 | 5/1998 |
| JP | H10-163132 | 6/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-540123 | 11/2009 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 705936 | 4/2007 |
| KR | 10-2008-0036679 | 4/2008 |
| KR | 20080110897 | 12/2008 |
| KR | 10-2009-0103815 | 10/2009 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/090295 | 6/2013 |
| WO | WO 2013/148444 | 10/2013 |
| WO | WO 2013/148880 | 10/2013 |
| WO | WO 2014/058536 | 4/2014 |

OTHER PUBLICATIONS

US Office Action, dated May 30, 2014, issued in U.S. Appl. No. 13/862,048.
US Office Action, dated Feb. 24, 2014, issued in U.S. Appl. No. 13/020,748.
US Final Office Action, dated Jul. 2, 2014, issued in U.S. Appl. No. 13/020,748.
US Office Action, dated Sep. 18, 2014, issued in U.S. Appl. No. 13/928,216.
US Notice of Allowance, dated May 23, 2014, issued in U.S. Appl. No. 13/633,798.
Chinese Third Office Action dated Apr. 22, 2014 issued in Application No. 200980133560.1.
Korean Office Action dated Jun. 17, 2014 issued in Application No. 10-2013-7027117.
Japanese Office Action dated Jun. 17, 2014 issued in Application No. JP 2010-055163.
Japanese Office Action dated Mar. 4, 2014 issued in JP 2010-093522.

(56) References Cited

OTHER PUBLICATIONS

Japanese Office Action dated Jul. 29, 2014 issued in JP 2010-093544.
Manik, P., et al. (2012) "Fermi-level unpinning and low resistivity in contacts to n-type Ge with a thin ZnO interfacial layer," App. Phys. Lett. 101:182105-5.
U.S. Appl. No. 14/135,375, filed Dec. 19, 2013, entitled "Method for Depositing Extremely Low Resistivity Tungsten."
US Notice of Allowance dated Dec. 24, 2013, issued in U.S. Appl. No. 12/723,532.
US Final Office Action, dated Feb. 14, 2014, issued in U.S. Appl. No. 13/560,688.
Japanese Office Action dated Dec. 3, 2013 issued in Application No. 2011-525228.
Korean Second Office Action dated Jan. 25, 2014 in KR Application No. 10-2010-0035453.
Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf], Materials Transactions, 43(7):1585-1592.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
U.S. Appl. No. 13/633,502, filed Oct. 2, 2012, entitled "Method for Producing Ultra-Thin Tungsten Layers With Improved Step Coverage."
U.S. Appl. No. 13/862,048, filed Apr. 12, 2013, entitled "CVD Based Metal/Semiconductor OHMIC Contact for High Volume Manufacturing Applications."
U.S. Appl. No. 13/758,928, filed Feb. 4, 2013, entitled "Methods for Forming All Tungsten Contacts and Lines."
U.S. Appl. No. 13/928,216, filed Jun. 26, 2013, entitled "Methods of Forming Tensile Tungsten Films and Compressive Tungsten Films."
U.S. Appl. No. 13/560,688, filed Jul. 27, 2012, entitled "Methods of improving Tungsten Contact Resistance in Small Critical Dimension Features."
U.S. Appl. No. 13/949,092, filed Jul. 23, 2013, entitled "Ternary Tungsten Boride Nitride Films and Methods for Forming Same."
U.S. Appl. No. 13/633,798, filed Oct. 2, 2012, entitled "Method for Depositing Tungsten Film With Low Roughness and Low Resistivity."
US Office Action, dated Jul. 17, 2002, issued in U.S. Appl. No. 09/975,074.
US Notice of Allowance, dated Mar. 12, 2003, issued in U.S. Appl. No. 09/975,074.
US Office Action, dated Feb. 8, 2005, issued in U.S. Appl. No. 10/649,351.
US Final Office Action, dated Jul. 14, 2005, issued in U.S. Appl. No. 10/649,351.
US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435,010.
US Notice of Allowance, dated Jan. 19, 2005, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2005, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Allowance dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.

(56) References Cited

OTHER PUBLICATIONS

US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 8, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Jun. 20, 2013, issued in U.S. Appl. No. 13/650,688.
US Office Action, dated Jun. 14, 2013, issued in U.S. Appl. No. 13/633,798.
US Final Office Action, dated Nov. 26, 2013, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Second Notification of Provisional Rejection, dated Aug. 25, 2011, issued in Application No. 2004-0036346.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. 200980133560.1.
Chinese Second Office Action dated Aug. 7, 2013 issued in Application No. 200980133560.1.
Korean Office Action dated Sep. 6, 2012 issued in Application No. 2011-7004322.
Korean Office Action dated Jul. 19, 2013 issued in Application No. 2011-7004322.
Korean Office Action dated Nov. 4, 2013 issued in Application No. 10-2013-7027117.
Korean Office Action dated Mar. 21, 2013 issued in KR Application No. 10-2010-0024905.
Korean Notification of Provisional Rejection dated Jul. 17, 2012, issued in Application No. 2010-0087997.
Korean Office Action dated Mar. 4, 2013 in KR Application No. 2010-0035449.
Korean Office Action dated Mar. 4, 2013 in KR Application No. 10-2010-0035453.
PCT International Search Report and Written Opinion, dated Mar. 28, 2013, issued in PCT/US2012/069016.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
Bell et al. (Jan. 1996) "Batch Reactor Kinetic Studies of Tungsten LPCVD from Silane and Tungsten Hexafluoride", J. Electrochem. Soc., vol. 143, No. 1, pp. 296-302.
Collins et al. (Jan. 21, 2003) "Pulsed Deposition of Ultra Thin Tungsten for Plugfill of High Aspect Ratio Contacts," Presentation made at Semicon Korea, 9 pages.
Collins et al. (Jan. 21, 2003) "Pulsed Deposition of Ultra Thin Tungsten for Plugfill of High Aspect Ratio Contacts," Semiconductor Equipment and Materials International, Semicon Korea, 3 pages.

(56) References Cited

OTHER PUBLICATIONS

Elam et al. (2001) "Nucleation and Growth During Tungsten Atomic Layer Deposition on $SiO_2$ Surfaces," Thin Solid Films, 13 Pages.

George et al. (1996) "Surface Chemistry for atomic Layer Growth", J. Phys. Chem, vol. 100, No. 31, pp. 13121-13131.

Hoover, Cynthia. (2007) "Enabling Materials for Contact Metallization," Praxair Electronic Materials R&D, pp. 1-16.

Lai, Ken K. and Lamb, H. Henry (1995) "Precursors for Organometallic Chemical Vapor Deposition of Tungsten Carbide Films", *Chemistry Material,* pp. 2284-2292.

Klaus et al. (2000) "Atomic layer deposition of tungsten using sequential surface chemistry with a sacrificial stripping reaction", Thin Solid Films 360 145-153.

Klaus et al. (2000) "Atomically Controlled Growth of Tungsten and Tungsten Nitride Using Sequential Surface Reactions," Applied Surface Science, 162-163, 479-491.

Lee et al. (Jan. 21, 2003) Pulsed Deposition of Ultra Thin Tungsten and its Application for Plugfill of High Aspect Ratio Contacts, Abstract, 1 page.

Li et al. (2002) "Deposition of $WN_xC_y$ Thin Films by ALCVD™ Method for Diffusion Barriers in Metallization," IITC Conference Report, 3 Pages.

Presentation by Inventor James Fair. (1983) "Chemical Vapor Deposition of Refractory Metal Silicides," 27 Pages.

Purchase of ethylcyclopentadienyl)dicarbonylnitrosyltungsten from Praxair (2006).

Saito et al. (2001) "A Novel Copper Interconnection Technology Using Self Aligned Metal Capping Method," IEEE, 3 Pages.

US Final Office Action, dated Nov. 5, 2014, issued in U.S. Appl. No. 13/633,502.

US Notice of Allowance, dated Mar. 2, 2015, issued in U.S. Appl. No. 13/633,502.

US Final Office Action, dated Oct. 16, 2014, issued in U.S. Appl. No. 13/862,048.

US Office Action, dated Dec. 11, 2014, issued in U.S. Appl. No. 14/173,733.

US Office Action, dated Jan. 15, 2015, issued in U.S. Appl. No. 13/774,350.

US Office Action, dated Dec. 23, 2014, issued in U.S. Appl. No. 13/851,885.

US Office Action, dated Dec. 18, 2014, issued in U.S. Appl. No. 14/502,817.

US Notice of Allowance, dated Jan. 22, 2015, issued in U.S. Appl. No. 13/928,216.

US Notice of Allowance, dated Nov. 4, 2014, issued in U.S. Appl. No. 13/560,688.

Chinese Fourth Office Action dated Jan. 5, 2015 issued in Application No. 200980133560.1.

Taiwan Office Action dated Dec. 27, 2014 issued in TW 099111860.

PCT International Preliminary Report on Patentability and Written Opinion, dated Oct. 9, 2014, issued in PCT/US2013/033174.

PCT International Preliminary Report on Patentability and Written Opinion, dated Oct. 9, 2014, issued in PCT/US2013/034167.

KR patent application No. 10-2014-0090283, Office Action mailed Jul. 10, 2015.

TW patent application No. 099111859, Office Action mailed Aug. 4, 2015.

\* cited by examiner

LOW TEMPATURE TUNGSTEN FILM DEPOSITION FOR SMALL CRITICAL DIMENSION CONTACTS AND INTERCONNECTS

CROSS-REFERENCE TO RELATED APPLICATIONS

This application is a continuation of U.S. application Ser. No. 12/755,259, filed Apr. 6, 2010, titled "METHODS FOR DEPOSITING ULTRA THIN LOW RESISTIVITY TUNGSTEN FILM FOR SMALL CRITICAL DIMENSION CONTACTS AND INTERCONNECTS," which claims the benefit under U.S.C. 119(e) to U.S. provisional application 61/169,954, filed Apr. 16, 2009, titled "METHOD FOR FORMING TUNGSTEN CONTACTS AND INTERCONNECTS WITH SMALL CRITICAL DIMENSIONS," all of which are incorporated herein in their entireties for all purposes.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer.

As semiconductor devices scale to the 32 nm technology node and beyond, shrinking contact and via dimensions make chemical vapor deposition of tungsten more challenging. Increasing aspect ratios can lead to voids or large seams within device features, resulting in lower yields and decreased performance in microprocessor and memory chips. The International Technology Roadmap for Semiconductors (ITRS) calls for 32 nm stacked capacitor DRAM contacts to have aspect ratios of greater than 20:1. Logic contacts, though not as aggressive as DRAM contacts, will still be challenged as aspect ratios grow to more than 10:1. Void-free fill in aggressive features like these is problematic using conventional CVD tungsten deposition techniques.

SUMMARY OF INVENTION

One aspect of the invention relates to methods of void-free tungsten fill of high aspect ratio features. According to various embodiments, the methods involve a reduced temperature chemical vapor deposition (CVD) process to fill the features with tungsten. In certain embodiments, the process temperature is maintained at less than about 350° C. during the chemical vapor deposition to fill the feature. The reduced-temperature CVD tungsten fill provides improved tungsten fill in high aspect ratio features, provides improved barriers to fluorine migration into underlying layers, while achieving similar thin film resistivity as standard CVD fill. Another aspect of the invention relates to methods of depositing thin tungsten films having low-resistivity. According to various embodiments, the methods involve performing a reduced temperature low resistivity treatment on a deposited nucleation layer prior to depositing a tungsten bulk layer and/or depositing a bulk layer via a reduced temperature CVD process followed by a high temperature CVD process.

DETAILED DESCRIPTION

Introduction

In the following description, numerous specific details are set forth in order to provide a thorough understanding of the present invention, which pertains to forming thin tungsten films. Modifications, adaptations or variations of specific methods and structures shown and discussed herein will be apparent to those skilled in the art and are within the scope of this invention.

Extending tungsten to sub-32 nm technologies is critical to maintaining via/contact performance and reliability in both memory and logic devices. There are various challenges in tungsten fill as devices scale to smaller technology nodes. One challenge is preventing an increase in resistance due to the thinner films in contacts and vias. As features become smaller, the tungsten (W) contact or line resistance increases due to scattering effects in the thinner W film. While efficient tungsten deposition processes require tungsten nucleation layers, these layers typically have higher electrical resistivities than the bulk tungsten layers. As features become smaller, low resistivity tungsten films minimize power losses and overheating in integrated circuit designs. The thin barrier and tungsten nucleation films, which are higher in resistivity, occupy a larger percentage of the smaller features.

Figure 1:
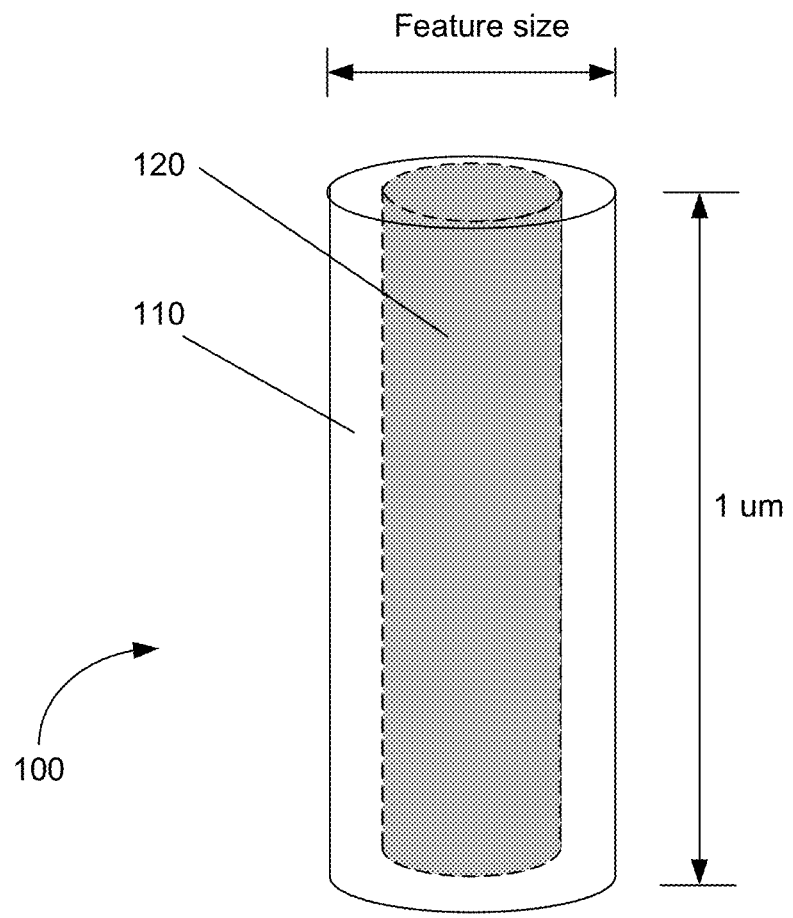
FIG. 1 is a schematic illustration of a feature filled with tungsten nucleation and bulk layers according to certain embodiments.
Figure 2:
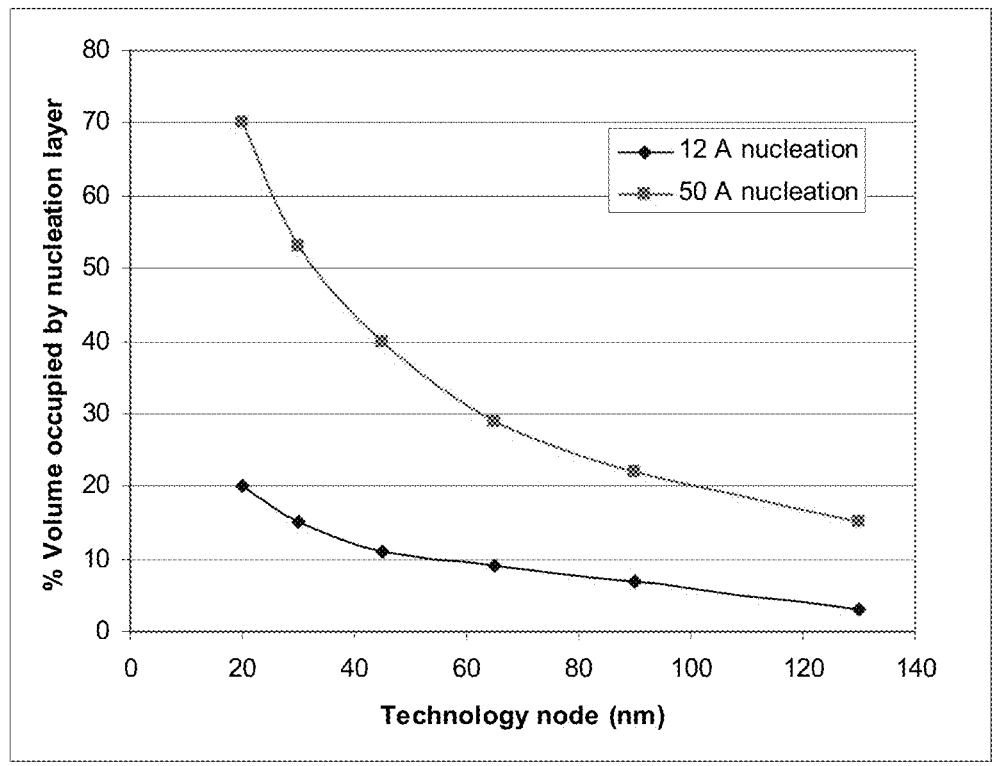
FIG. 2 is a plot showing volume percentage of a feature occupied by a nucleation layer as a function of technology node (feature size) for 12 Å and 50 Å nucleation layers.

FIG. 1 shows a volume occupied by a nucleation film 110 and a bulk tungsten material 120 in a via/contact structure 100. FIG. 2 shows the percent the percent volume occupied by 12 Å and 50 Å nucleation films as a function of technology node. Because the resistivity of the nucleation layer is higher than that of the bulk layer ($\rho_{nucleation} > \rho_{bulk}$) the thickness of the nucleation layer should be minimized to keep the total resistance as low as possible. On the other hand, the tungsten nucleation should be sufficiently thick to fully cover the underlying substrate to support high quality bulk deposition.

Another challenge in tungsten plugfill as devices scale to smaller technology nodes is step coverage. Stacked capacitor DRAM contacts, for example, require high aspect ratio tungsten fill of features greater than 20:1 at 32 nm nodes. Logic contacts, though not as aggressive as DRAM contacts, still have challenges as the smaller contact openings increase the aspect ratio requirements to near 10:1. Memory devices typically use CVD $TiCl_4$ based Ti/TiN liner/barriers, which are fairly conformal. Logic devices, however, still rely on PVD/MOCVD based Ti/TiN films that create additional step coverage challenges associated with large overhang that creates a reentrant shape or pinch off. PVD overhang from the liner/barrier film magnifies the difficulty in filling small features. This makes it difficult to fill features not only with the nucleation film, but ultimately the bulk CVD film. Incoming overhang combined with the dimensions of high aspect ratio structures makes it difficult or impossible to achieve void-free plugfill using CVD tungsten deposition processes used in previous technology nodes.

According to various embodiments, the present invention provides tungsten fill processes to overcome aggressive aspect rations and liner/barrier step coverage limitations, including reducing nucleation film thickness and improving step coverage of the fill process. In certain embodiments, the methods also provide superior barrier films against fluorine attack of the underlying barrier/liner layer.

Figure 3:
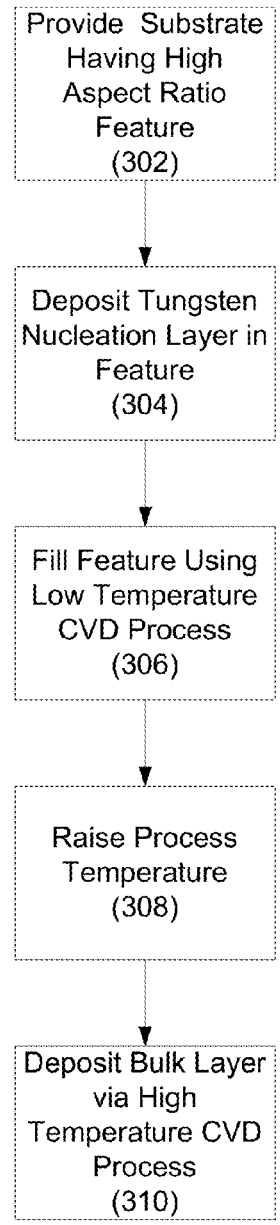
FIG. 3 is a process flow diagram illustrating operations in a method of filling a feature with tungsten according to various embodiments.

FIG. 3 presents a process flow sheet illustrating operations in a method of providing fill according to certain embodiments. The process begins by providing substrate having a high aspect ratio feature formed therein. (302). While embodiments of the invention are not limited to high aspect ratio features, the methods described herein are critical to achieving good void-free fill in high aspect ratio features, for which CVD processes used to fill features in earlier technology nodes do not provide adequate fill. According to various embodiments, the substrate feature has an aspect ratio of at least 10:1, at least 15:1, at least 20:1, at least 25:1 or at least 30:1. Also according to various embodiments, the feature size is characterized by the feature opening size in addition to or instead of the aspect ratio. The opening may be from 10 nm-100 nm, or 10 nm-50 nm wide. For example, in certain embodiments, the methods may be advantageously used with features having narrow openings, regardless of the aspect ratio.

In certain embodiments, the recessed feature is formed within a dielectric layer on a substrate, with the bottom of the feature providing contact to an underlying metal layer. Also in certain embodiments, the feature includes a liner/barrier layer on its sidewalls and/or bottom. Examples of liner layers include Ti/TiN, TiN and WN. In addition to or instead of diffusion barrier layers, the feature may include layers such as an adhesion layer, a nucleation layer, a combination of thereof, or any other applicable material lining the sidewalls and bottom of the feature.

In certain embodiments, the feature is a re-entrant feature; that is the liner layer or other material forms an overhang that partially blocks the feature opening. Because many deposition processes do not have good step coverage properties, i.e., more material is deposited on the field region and near the opening than inside the feature, the liner layer thicker near the opening than, for example, inside the feature. For the purposes of this description, "near the opening" is defined as an approximate position or an area within the feature (i.e., along the side wall of the feature) corresponding to between about 0-10% of the feature depth measured from the field region. In certain embodiments, the area near the opening corresponds to the area at the opening. Further, "inside the feature" is defined as an approximate position or an area within the feature corresponding to between about 20-60% of the feature depth measured from the field region on the top of the feature. Typically, when values for certain parameters (e.g., thicknesses) are specified "near the opening" or "inside the feature", these values represent a measurement or an average of multiple measurements taken within these positions/areas. In certain embodiments, an average thickness of the under-layer near the opening is at least about 10% greater than that inside the feature. In more specific embodiments, this difference may be at least about 25%, at least about 50%, or at least about 100%. Distribution of a material within a feature may also be characterized by its step coverage. For the purposes of this description, "step coverage" is defined as a ratio of two thicknesses, i.e., the thickness of the material inside the feature divided by the thickness of the material near the opening. In certain examples, the step coverage of the liner or other under-layer is less than about 100% or, more specifically, less than about 75% or even less than about 50%.

Returning to FIG. 3, a tungsten nucleation layer is then deposited in the feature, typically to conformally coat the sidewalls and bottom of the feature (304). In general, a nucleation layer is a thin conformal layer which serves to facilitate the subsequent formation of a bulk material thereon. Conformation to the underlying feature is critical to support high quality deposition. Various processes may be used to form the nucleation layer, including but not limited to, CVD processes, atomic layer deposition (ALD) processes and pulsed nucleation layer (PNL) deposition processes.

In a PNL technique, pulses of reactants are sequentially injected and purged from the reaction chamber, typically by a pulse of a purge gas between reactants. A first reactant is typically adsorbed onto the substrate, available to react with the next reactant. The process is repeated in a cyclical fashion until the desired thickness is achieved. PNL is similar to atomic layer deposition techniques reported in the literature. PNL is generally distinguished from ALD by its higher operating pressure range (greater than 1 Torr) and its higher growth rate per cycle (greater than 1 monolayer film growth per cycle). In the context of the description provided herein, PNL broadly embodies any cyclical process of sequentially adding reactants for reaction on a semiconductor substrate. Thus, the concept embodies techniques conventionally referred to as ALD. In the context of description provided herein, CVD embodies processes in which reactants are together introduced to a reactor for a vapor-phase reaction. PNL and ALD processes are distinct from CVD processes and vice-versa.

Forming a nucleation layer using one or more PNL cycles is discussed in U.S. Pat. Nos. 6,844,258; 7,005,372; 7,141,494; 7,262,125; and 7,589,017; US Patent Publication Nos. 2008/0254623 and 2009/0149022, and U.S. patent application Ser. No. 12/407,541, all of which references are incorporated herein by reference in their entireties. These PNL nucleation layer processes involve exposing a substrate to various sequences of reducing agents and tungsten precursors to grow a nucleation layer of the desired thickness. A combined PNL-CVD method of depositing a nucleation layer is described in U.S. Pat. No. 7,655,567, also incorporated in its entirety.

Nucleation layer thickness is enough to support high quality deposition. In certain embodiments, the requisite thickness depends in part on the nucleation layer deposition method. As described further below, in certain embodiments a PNL method providing near 100% step coverage nucleation film at thicknesses as low as about 12 Å (as compared to typical nucleation films of 50 Å) may be used in certain embodiments. Regardless of the method used to deposit the nucleation layer, however, the reduced temperature CVD operation used to fill the feature can be used with thinner nucleation layers than required by conventional higher temperature CVD. Without being bound by any particular theory, it is believed that this may be because the slower chemistry at the reduced temperatures improves growth even on nucleation sites that are not fully developed. According to various embodiments, nucleation layers of between about 30-50 Å (3-5 nm) may be formed, in certain embodiments, as low as 10-15 Å.

In certain embodiments, depositing the nucleation layer is followed by a post-deposition treatment operation to improve resistivity. Such treatment operations are described further below and in more detail in U.S. Patent Publication No. 2009/0149022, and U.S. patent application Ser. No. 12/407,541, both of which are incorporated by reference herein.

Once the nucleation layer is formed, the process continues by filling the feature with a low-temperature CVD tungsten film (306). In this operation, a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain embodiments, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain embodiments, the tungsten-containing precursor is a halogen-containing compound, such as $WF_6$. In certain embodiments, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many embodiments, hydrogen gas is used as the reducing agent in the CVD process.

CVD filling of the feature is performed at a reduced temperature. According to various embodiments, the reduced temperature (process and/or substrate temperature) is in one of the following ranges: between about 250-350° C., between about 250° C.-340° C., between about 250° C.-330° C., between about 250° C.-325° C., between about 250° C.-320° C., between about 250° C.-315° C., between about 250° C.-310° C., between about 250° C.-305° C., or between about 250° C.-300° C. Also according to various embodiments, the process and/or substrate temperature is: between about 260-310° C., between about 270° C.-310° C., between about 280° C.-310° C., or between about 290° C.-310° C. In certain embodiments, the process and/or substrate temperature is about 300° C.

After filling the feature, the temperature is raised to deposit a high temperature CVD layer (308). The high temperature may be in one of the following ranges: between about 350-450° C., between about 360° C.-450° C., between about 370° C.-450° C., between about 380° C.-450° C., between about 390° C.-450° C., or between about 400° C.-450° C. In certain embodiments, the high temperature CVD is performed at about 395° C. Raising the temperature may involve raising the substrate temperature. According to various embodiments, the temperature is raised at least about 50° C., at least about 60° C., at least about 70° C., at least about 80° C., at least about 90° C., at least about 100° C., or at least about 110° C. The high temperature CVD layer is then deposited (310). In certain embodiments, operations 308 and 310 are not performed; that is, after the low temperature CVD process is complete and the feature is filled, the substrate moves on for further processing such as planarization.

In certain embodiments, transitioning from operation 306 to operation 308 involves moving the substrate from one deposition station to another in a multi-station chamber. Still further, each of operation 304, the post-deposition resistivity treatment (if performed), operation 306 and operation 308 is performed in a different station of the same multi-station chamber.

In alternative embodiments in which a single station is used to perform operations 306 and 308, transitioning from operation 306 to operation 308 involved shutting off a flow of tungsten precursor (optionally allowing hydrogen or other reducing gas and/or carrier gas to run), while raising the substrate temperature. Once the substrate temperature is stabilized, the tungsten precursor and other gases, if necessary, are flowed into the reaction chamber for the high temperature deposition. In other embodiments, transitioning from operation 306 may involve raising the substrate temperature while allowing the deposition to continue during the transition period.

Figure 4:
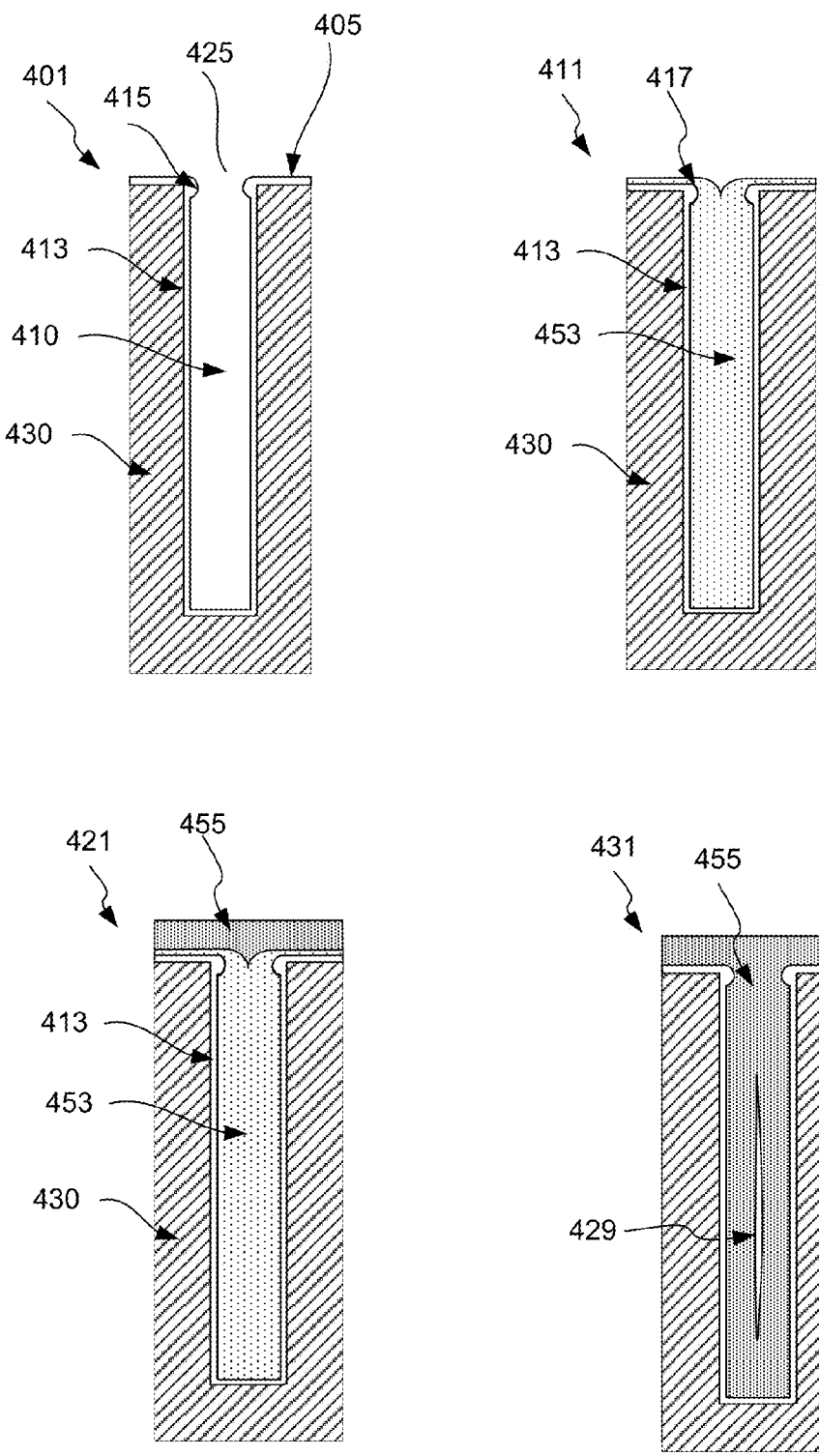
FIG. 4 depicts schematic illustrations of feature cross-sections at various stages of a process according to certain embodiments.

In embodiments in which the high temperature tungsten CVD film is deposited, it may be deposited as an overburden layer on the filled feature. FIG. 4 illustrates schematic representations of one example of a feature's cross-sections at different stages of a filling process in which a high temperature CVD layer is deposited after the feature 410 is filled using reduced temperature CVD. Cross-section 401 represents an example of the feature 410 prior to any tungsten deposition. In this example, the feature 410 is formed in a dielectric layer 430, has an opening 425 at the top surface 405 of the substrate and includes a liner layer 413, such as TiN layer. In certain embodiments, the size of the cavity near the opening 425 is narrower that inside the feature, for example, due to overhang 415 of the under-layer 413 as depicted in FIG. 4.

Cross-section 411 represents the feature after reduced temperature CVD is performed to fill the feature with low temperature CVD bulk layer 453. (The tungsten nucleation layer is not depicted in FIG. 4.) In certain embodiments, the reduced temperature CVD is performed at least until the feature corner 417 (the point at which the substrate transitions from a planar region to the recessed feature) is covered with low temperature CVD tungsten. This is because in certain embodiments the liner, dielectric or other under-layer is particularly vulnerable to $F_2$ attack at the feature corner. As discussed further below, the reduced temperature CVD tungsten has unexpectedly good barrier properties, and protects the under-layer from $F_2$ exposure during the subsequent high temperature CVD deposition.

Cross-section 421 represents the feature after the higher temperature CVD is performed to deposit an overburden layer 455. The feature sidewalls and corners are protected from $F_2$ attack by the low-temperature CVD film 453. Cross-section 431 provides a comparative example of a narrow feature such as that depicted in cross-section 401 filled using a conventional (high temperature) process. With a high temperature process, because of the overhang 415 and the relatively poor step coverage of the high temperature layer 455, the closed feature has an unfilled void 429 (i.e., a seam). The seam is problematic for a variety reasons—increasing resistance in the feature and causing problems during chemical-mechanical planarization (CMP). Although not visible in the schematic, the corners or other parts of the liner have adhesion problems due to $F_2$ attack, exhibiting peeling or and defects. Such defects are discussed further below with reference to FIG. 6.

Figure 5:
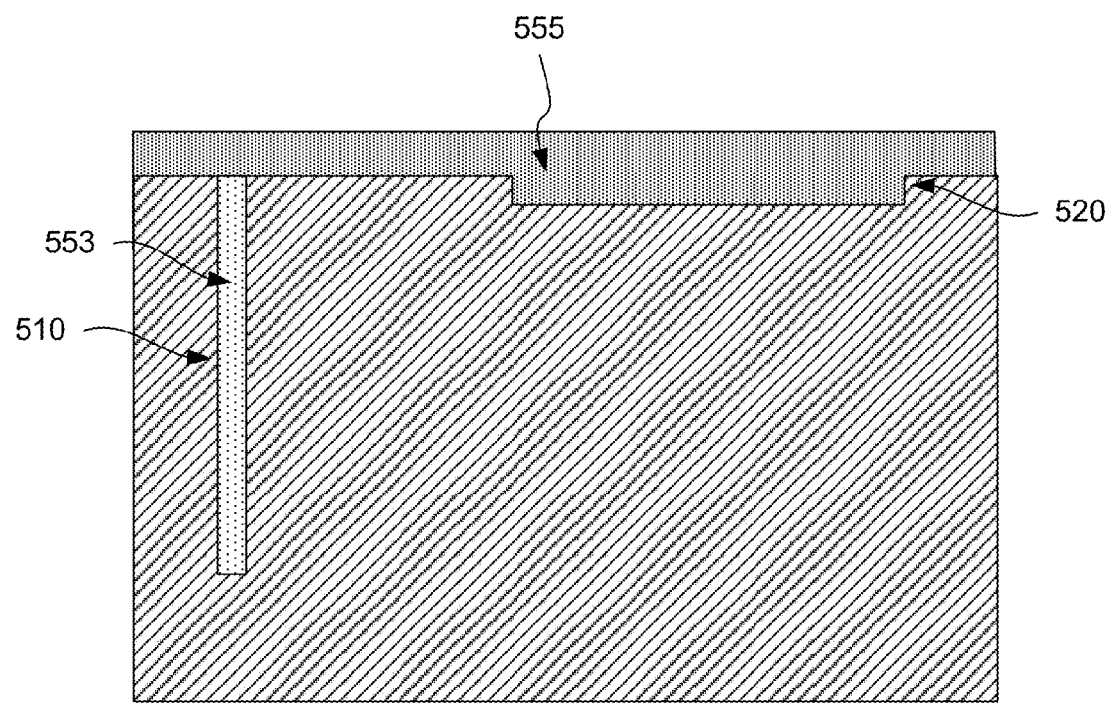
FIG. 5 depicts a schematic illustration of a substrate cross-section after a feature filling process according to certain embodiments.

In certain embodiments, a substrate having both high aspect ratio features and low aspect ratio features to be filled with tungsten is provided. For example, a substrate may have one or more features having an aspect ratio of at least about 10:1 and one or more features having aspect ratio of less than about 5:1, or 1:1 or 1:2. A reduced temperature CVD operation may then be performed to fill the one or more high aspect ratio features, followed by a high temperature CVD operation to fill the low aspect ratio features. FIG. 5 depicts an example of a high aspect ratio feature 510 and a low aspect ratio feature 520 filled in this manner. Feature 510 is filled with low temperature CVD film 553, critical to providing good void-free fill in narrow opening, high aspect ratio features. Due to its wide opening (e.g., on the order of hundreds of nanometers to a few microns), an insignificant amount of low-temperature CVD film is deposited into feature 520. A high temperature CVD operation is then used to fill feature 520 with high temperature CVD film 555, and in this case, deposit overburden.

Reduced temperature CVD is critical to obtaining high quality tungsten fill in narrow, high aspect ratio features. Current tungsten CVD is performed at temperatures around 400° C. Obtaining excellent plugfill on advanced node features is a challenge that is magnified when the features have pinched openings (as illustrated at cross-section 401 of FIG. 4). Another challenge is presented by thinning TiN barriers to allow more space in the features for tungsten deposition. In certain embodiments, the advanced node features have barrier layers as less than 5 nm thick, as thin as 1 nm. Fluorine migration from the $WF_6$ in conventional CVD processes into the Ti liner region results in integration problems include fluorine attack of the liner and yield loss.

The reduced temperature CVD described above is critical to obtaining high quality plugfill. Without being bound by a particular theory, it is believed that the high quality plugfill provided by the reduced temperature CVD is due to a number of factors. First, lower CVD temperature decreases the tungsten deposition rate by reducing thermal decomposition of the tungsten-containing precursor. This is believed to aid in plugfill in high aspect ratio, narrow features by reducing tungsten deposition at the feature opening thereby allowing more $WF_6$ (or other tungsten-containing precursor) molecules to reach the lower regions of the feature and deposit tungsten. In conventional CVD processes, deposition at the top of the feature prevents precursor diffusion into the lower region of the feature. The result is voids or seams in the internal region of the feature, such as depicted in cross-section 431 in FIG. 4. Better plugfill has multiple benefits: it results in more tungsten in the feature, promoting electron transport and reducing contact and line resistance, and it prevents post-CMP problems. For example, it reduces the likelihood that CMP slurry is trapped in seams and voids.

In addition to the above mechanisms, it is believed that excellent plugfill is due to insufficient energy at the reduced temperatures to promote fluorine migration through the tungsten nucleation and TiN layers and/or insufficient energy to form $TiF_x$ from a reaction between Ti and F or Ti and $WF_6$, even if the fluorine atoms or tungsten hexafluoride molecules do migrate. A low temperature CVD reaction minimizes Ti attack by fluorine.

Figure 6:
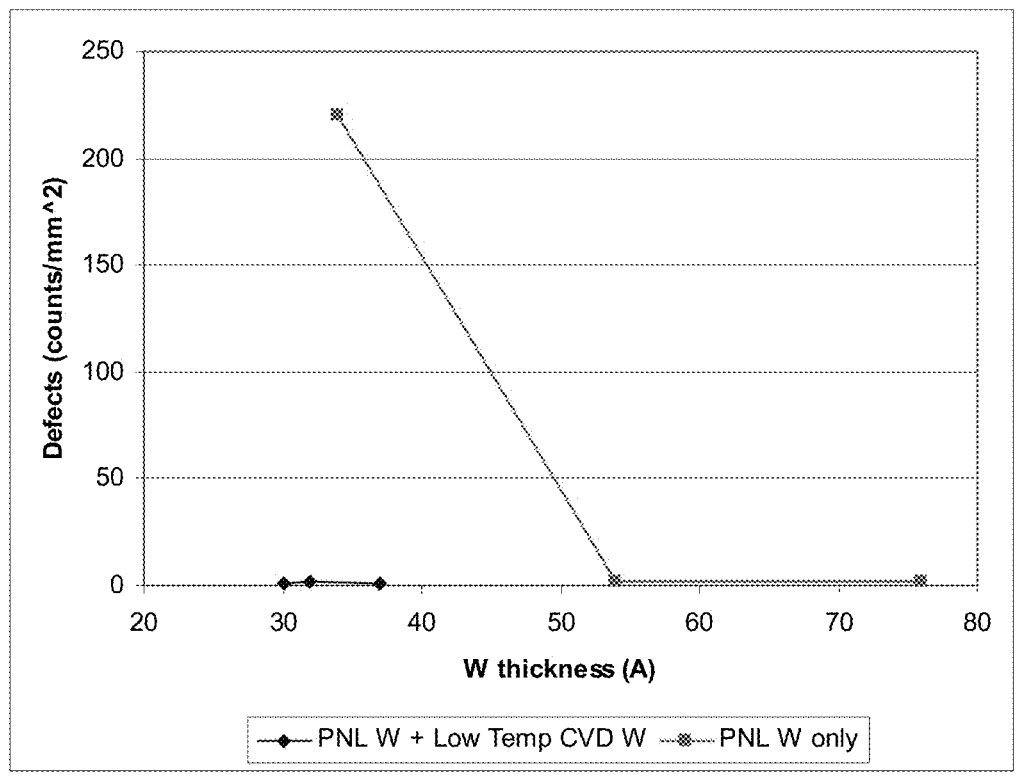
FIG. 6 is a plot depicting defects as a function of film thickness for a films deposited 1) by a pulsed layer nucleation (PNL) process and low temperature chemical vapor deposition (CVD) process and 2) by a PNL process only.

In addition to the above, it was found that low temperature CVD tungsten film provides unexpectedly good fluorine barrier properties compared to tungsten films deposited by other processes. FIG. 6 shows results of a defect study conducted on conventional PNL W and PNL W+low temperature CVD. PNL W only or PNL W+low temperature W films were deposited on a Ti/TiN substrate at the following thicknesses:
PNL W only: 34 Å, 54 Å and 76 Å
PNL W+low temp CVD W: 22 Å PNL+8 Å CVD (30 Å total), 22 Å PNL+10 Å CVD (32 Å total), 22 Å PNL+15 Å CVD (37 Å total)

Both PNLW and low temp CVD occurred at 300° C. Then the W films were subjected to a torture test where they were exposed to $WF_6$ at 395° C. If fluorine diffuses through the W film and the TiN it reacts with the underlying Ti to form volatile $TiF_x$ compounds and results in typical "volcano" defects as well as local peeling, cracking or bubbling. These defects are visible under an optical microscope. As shown in FIG. 6, low temperature CVD W along with thin PNL W behaved as a better W diffusion layer than PNL W only. This is an unexpected result in that for the same overall thickness of W film the low temperature CVD film provides improved F barrier properties. It would have been expected that the thin PNL+low temperature CVD layer would have similar defect counts as the thin PNL layer deposited at the same temperature.

A fluorine attack study was performed on wafers patterned with 100 nm opening/10:1 aspect ratio features including PVD Ti/MOCVD TiN barrier layers. A tungsten nucleation layer was deposited in the features, with a thin (12 Å) layer used so as to generate an exaggerated signal. Features were filled with either 395° C. CVD tungsten or 350° C. CVD tungsten. Feature fill was then examined and compared. The low temperature CVD fill provided better plugfill as well as reduced fluorine attack. In addition to showing reduced fluorine attack, the results indicate that reduced temperature provides better step coverage on thin nucleation layers. Without being bound by any particular theory, it is believed that the slower chemistry of the reduced temperature process allows growth on nucleation sites that are not fully formed.

Figure 7:
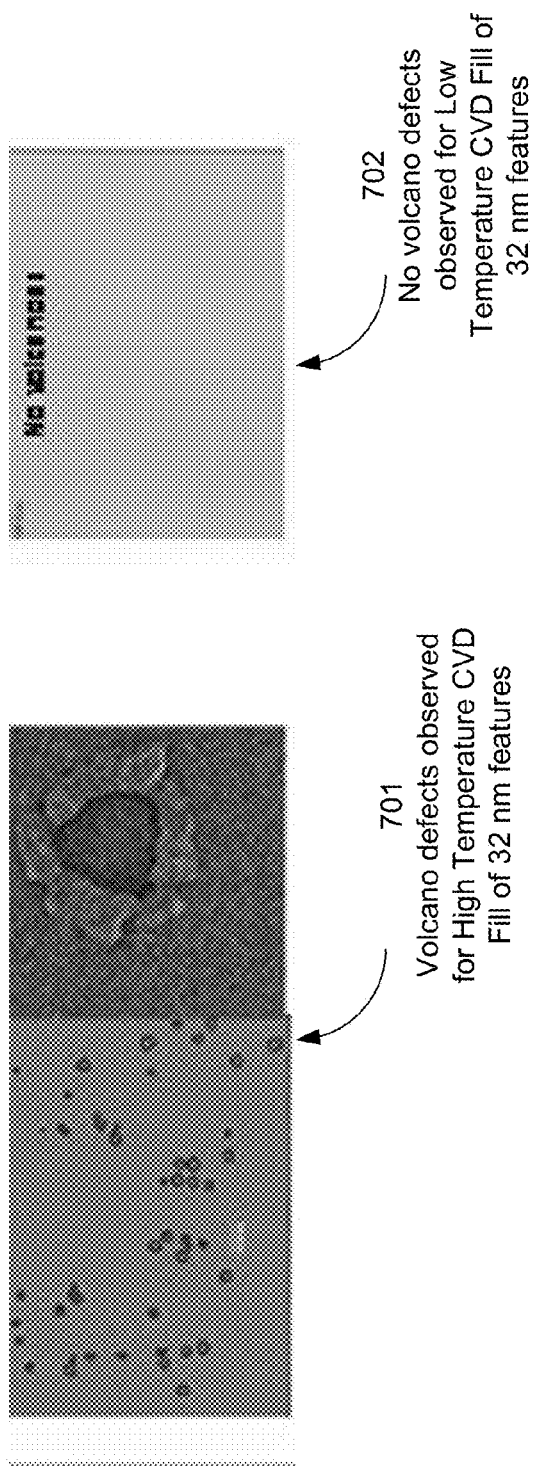
FIG. 7 depicts images of films after high and low temperature CVD fill of 32 nm features.
Figure 8:
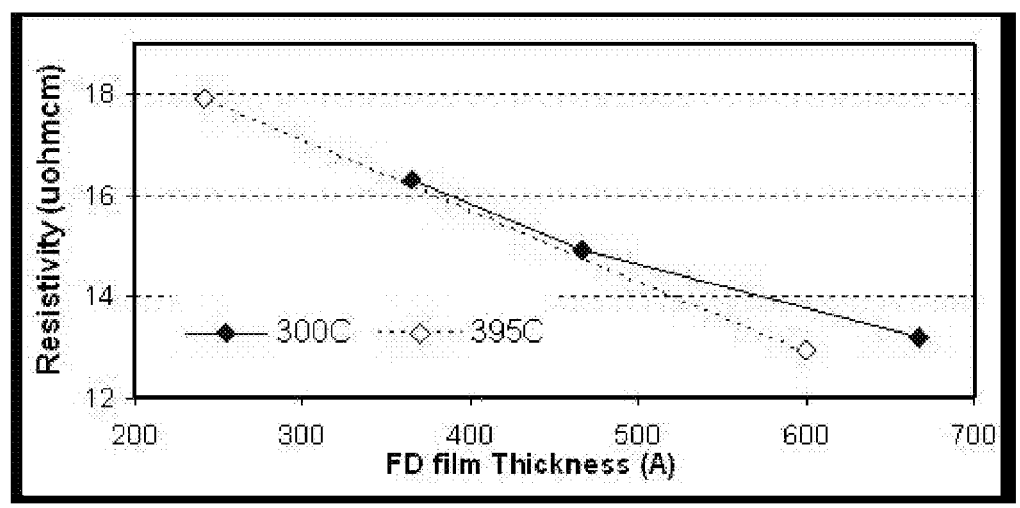
FIG. 8 depicts resistivity as a function of film thickness for films deposited by high and low temperature CVD.

Fill of 32 nm re-entrant features was performed using 300° C. and 395° C. The filled features were compared, and the films were examined for volcano defects. Low temperature CVD resulted in better fill, with fewer or no seams or voids. Voids were observed in the high temperature CVD filled features. FIG. 7 shows microscopic images of the 395° C. film (701) and the 300° C. film (702). Many volcano defects are observed in the 395° C. film; none in the 300° C. film. In addition to providing improved plugfill and reduced fluorine attack, the low temperature films have resistivities comparable to the high temperature films. This is shown in FIG. 8.

Also provided are improved methods of depositing ultra-low resistivity tungsten films. According to various embodiments, these methods involve depositing a thin PNL nucleation layer, performing a low resistivity treatment on the nucleation layer, and depositing a high temperature CVD layer to fill the feature. In certain embodiments, the low resistivity treatment includes a low temperature CVD process.

Figure 9:
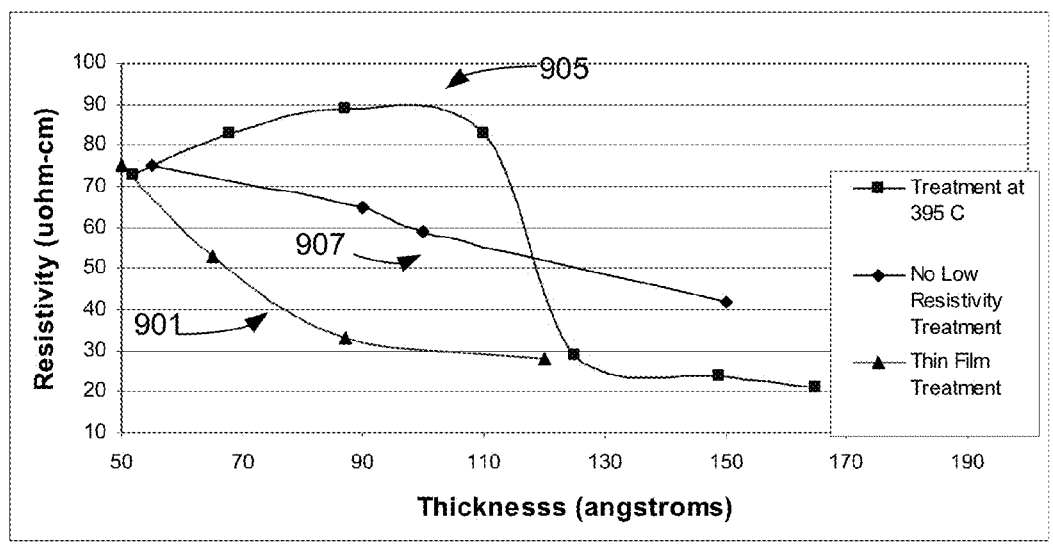
FIG. 9 is a plot depicting resistivity as a function of film thickness for tungsten films deposited by various processes.

It has been found that low resistivity processes that grow low resistivity tungsten for thicknesses larger than 20 nm and above may not grow low resistivity tungsten at thicknesses of 20 nm or less. When the critical dimension of the devices reduces to 40 nm or lower, the thickness of the tungsten layers in the structures is 20 nm or less. FIG. 9 presents a plot illustrating film resistivity as a function of thickness for films treated using a first low resistivity process (905) and for films treated using a thin film low resistivity process according to certain embodiments (901). For comparison, a film deposited without low resistivity treatment (907) is depicted.

The process used to deposit films represented by 905 involves depositing a PNL nucleation layer in a hydrogen-free ambient at reduced temperature followed by a high temperature low resistivity treatment. The untreated films (data series 907 were deposited by a PNL nucleation layer, with no low resistivity treatment. Nucleation layers of about 20-25 Å were deposited, with the remaining thickness deposited by low-temperature CVD. While the high temperature treatment results in film having lower resistivity for thicknesses greater than 120 Å (12 nm), the opposite is true for thicknesses less than 120 Å. Process parameters for deposition of the films are shown below:

The increase in resistivity for thin films treated via with high temperature process was unexpected. As can be seen from the figure, the low-resistivity treatment according to an embodiment of the inventive processes provides low resistivities even for films less than 120 Å. According to various embodiments, the thin film resistivity treatment involves performing a low temperature resistivity treatment involving exposing a deposited nucleation layer to multiple pulses of reducing agent at a reduced temperature. The multiple pulses of reducing agent may or may not include intervening pulses of a tungsten-containing precursor. Also according to various embodiments, the thin film resistivity treatment involves a partial fill via reduced temperature CVD prior to completing fill via high temperature CVD. While depositing some amount of the bulk CVD material, the reduced temperature CVD operation may be considered as a low-resistivity treatment. In certain embodiments, the processes involve both a low temperature exposure to multiple pulses of reducing agent and a partial fill via reduced temperature CVD, as in the films represented by data series 901 in FIG. 9.

While these processes described herein are appropriate for filling features having sub-40 nm critical dimensions, in particular for films having critical dimensions of 32 nm or smaller, they may also be employed for thicker films. As discussed further below, the improved resistivity is also observed for thicker films.

Figure 10:
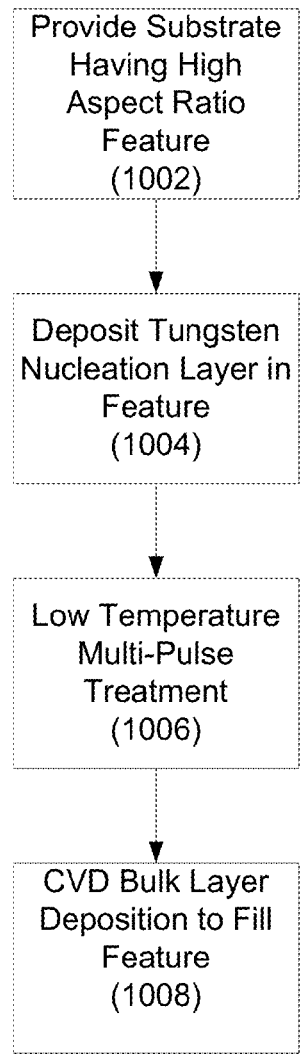
FIGS. 10-12 are process flow diagrams illustrating operations in methods of filling a feature with tungsten according to various embodiments.
Figure 11:
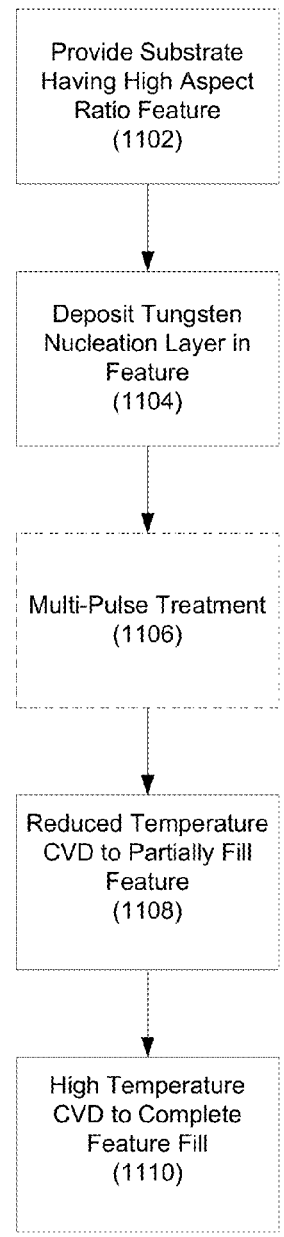
Figure 12:
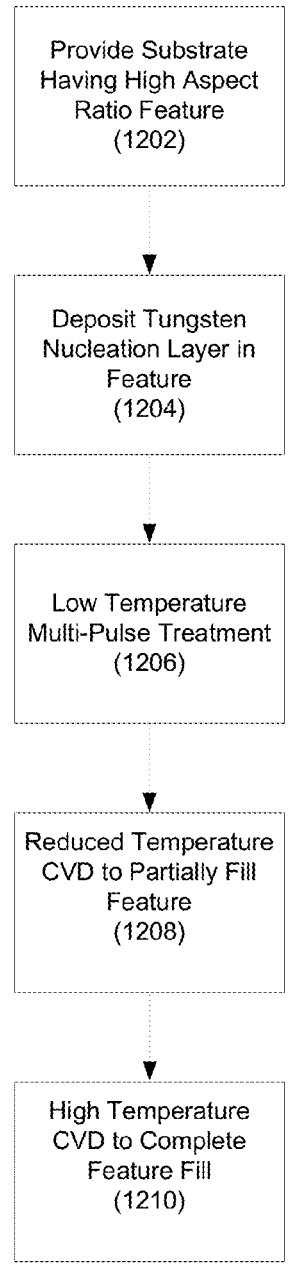

FIGS. 10-12 present process flow sheets illustrating operations in methods of filling features with low resistivity tungsten according to various embodiments. First, in FIG. 10, a substrate having a high aspect ratio recessed feature is provided to a deposition chamber (1002). As noted above, the feature may have a narrow opening, e.g., 40 nm in width or less. Also in certain embodiments, the method may be used to fill features having lower aspect ratios and/or wider openings. A tungsten nucleation layer is then deposited in the feature (1004).

While the nucleation layer may be deposited by any known method, in certain embodiments, improved resistivity is obtained by depositing the nucleation layer at low temperature, then performing a multi-pulse low resistivity treatment. Such methods of depositing the nucleation layer are described in U.S. Pat. No. 7,589,017, incorporated by reference herein and in U.S. Patent Publication 2008/0254623, also incorporated by reference herein.

Figure 13:
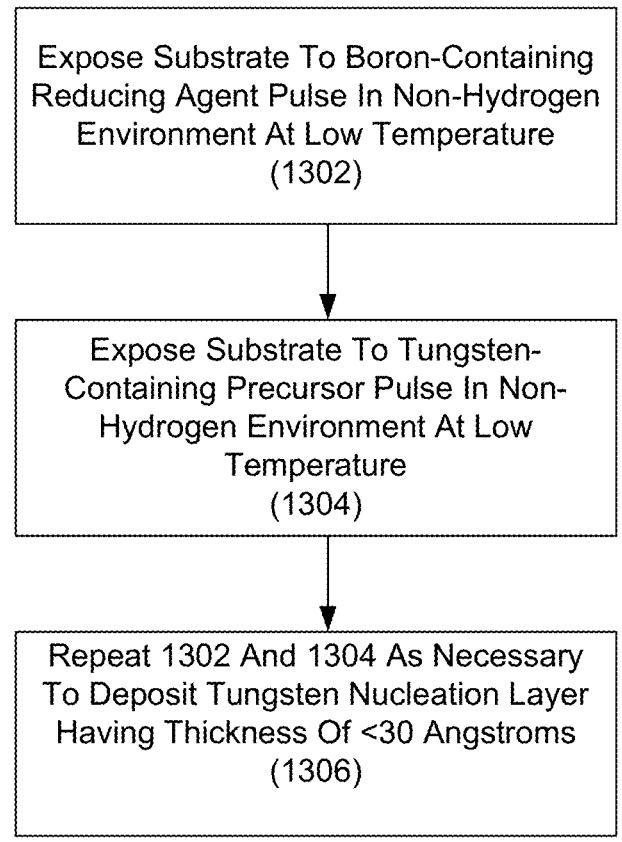
FIG. 13 is a process flow diagram illustrating operations in a method of depositing a tungsten nucleation layer that may be employed with certain embodiments.

In certain examples, the nucleation layer is deposited as described in FIG. 13. After a substrate without a nucleation layer (as at 401 in FIG. 4) is provided, the as-provided substrate is exposed to a boron-containing reducing agent to form

| Data series | Nucleation layer pulse sequence | Nucleation layer temperature | Low resistivity treatment pulse sequence | Low resistivity treatment temperature | CVD chemistry | CVD temperature |
|---|---|---|---|---|---|---|
| 907 (no Treatment) | B/W/S/W + 3 × (S/W) (H$_2$ ambient) | 300° C. | n/a | n/a | WF$_6$ and H$_2$ | 300° C. |
| 905 (high temperature treatment) | 5 × (B/W) (H$_2$-free ambient) | 300° C. | 6 × (B) | 395° C. | WF$_6$ and H$_2$ | 300° C. |
| 901 (thin film resistivity treatment) | 5 × (B/W) (H$_2$-free ambient) | 300° C. | 6 × (B) | 300° C. | WF$_6$ and H$_2$ | 300° C. (partial thickness) 395° C. (remaining thickness) |

B = B$_2$H$_6$/W = WF$_6$/S = SiH$_4$ a boron-containing layer on the substrate surface (1302). The boron-containing layer is often a layer of elemental boron, though in some embodiments, it may contain other chemical species or impurities from the boron-containing species itself or from residual gases in the reaction chamber. Any suitable boron-containing species may be used, including borane ($BH_3$), diborane ($B_2H_6$), triborane, etc. Examples of other boron-containing species include boron halides (e.g., $BF_3$, $BCl_3$) with hydrogen.

Substrate temperature is low—below about 350° C., for example between about 250° C. and 350° C. or 250° C. and 325° C. In certain embodiments, the temperature is around 300° C. In certain embodiments, diborane is provided from a diluted source (e.g., 5% diborane and 95% nitrogen). Diborane may be delivered the reaction chamber using other or additional carrier gases such as nitrogen and/or argon. Importantly, no hydrogen is used.

Once the boron-containing layer is deposited to a sufficient thickness, the flow of boron-containing species to the reaction chamber is stopped and the reaction chamber is purged with a carrier gas such as argon, hydrogen, nitrogen or helium. In certain embodiments, only argon is used at the carrier gas. The gas purge clears the regions near the substrate surface of residual gas reactants that could react with fresh gas reactants for the next reaction step.

Continuing to the next operation in FIG. 13, the substrate is contacted with a tungsten-containing precursor to form a portion of the tungsten nucleation layer (1304). Any suitable tungsten-containing precursor may be used. In certain embodiments the tungsten-containing precursor is one of $WF_6$, $WCl_6$ and $W(CO)_6$. The tungsten-containing precursor is typically provided in a dilution gas, such as argon, nitrogen, or a combination thereof. As with the boron-containing precursor pulse, the tungsten-containing precursor is delivered in a non-hydrogen environment. The substrate temperature is low—below about 350° C., for example between about 250° C. and 350° C. or 250° C. and 325° C. In certain embodiments, the temperature is around 300° C. In many cases, the substrate temperature is the same as during the exposure to the boron-containing species. Tungsten-containing precursor dosage and substrate exposure time will vary depending upon a number of factors. In general, the substrate is exposed until the adsorbed boron species is sufficiently consumed by reaction with the tungsten-containing precursor to produce a portion of the tungsten nucleation layer. Thereafter, the flow of tungsten-containing precursor to the reaction chamber is stopped and the reaction chamber is purged. The resulting portion of tungsten nucleation layer deposited in one boron-containing reducing agent/tungsten-containing precursor PNL cycle may be about 5 Å.

The low temperature boron-containing reducing agent pulse and tungsten precursor pulse operations are repeated to build up the tungsten nucleation layer to the desired thickness (1306). Between about 2-7 PNL cycles are required to deposit the very thin nucleation layer in certain embodiments, although in certain embodiments a single cycle may be sufficient. Depending on the substrate, the first one or two cycles may not result in thickness gain due to nucleation delay. As described previously, the tungsten nucleation layer should be sufficiently thin so as to not unduly increase the overall tungsten film, but sufficiently thick so as to support a high quality bulk tungsten deposition. The process described above is able to deposit a tungsten nucleation layer that can support high quality bulk deposition as low as about 10 Å in the high aspect ratio and/or narrow width feature. The thickness of the deposited nucleation layer is typically between about 10 Å and 50 Å, or for example, between 10 Å and 30 Å.

Temperature is one of the process conditions that affects the amount of tungsten deposited. Others include pressure, flow rate and exposure time. Maintaining temperatures at or below about 350° C. results in less material deposited during a cycle. This in turn provides lower resistivity. In some embodiments, temperatures may be about 300° C. or 200° C.

Figure 14A:
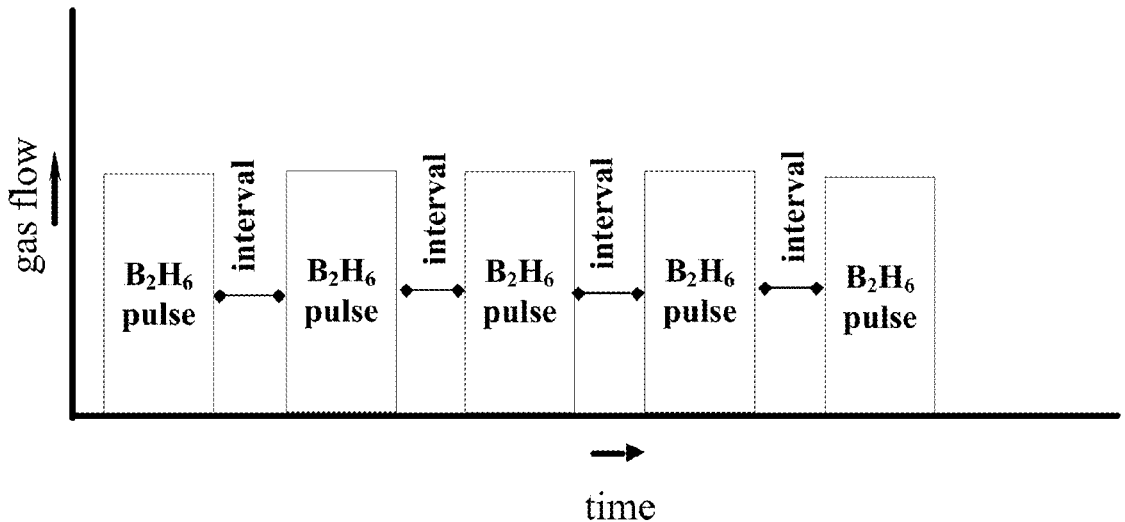
FIGS. 14A and 14B illustrates gas pulse sequences in a low resistivity treatment according to various embodiments.
Figure 14B:
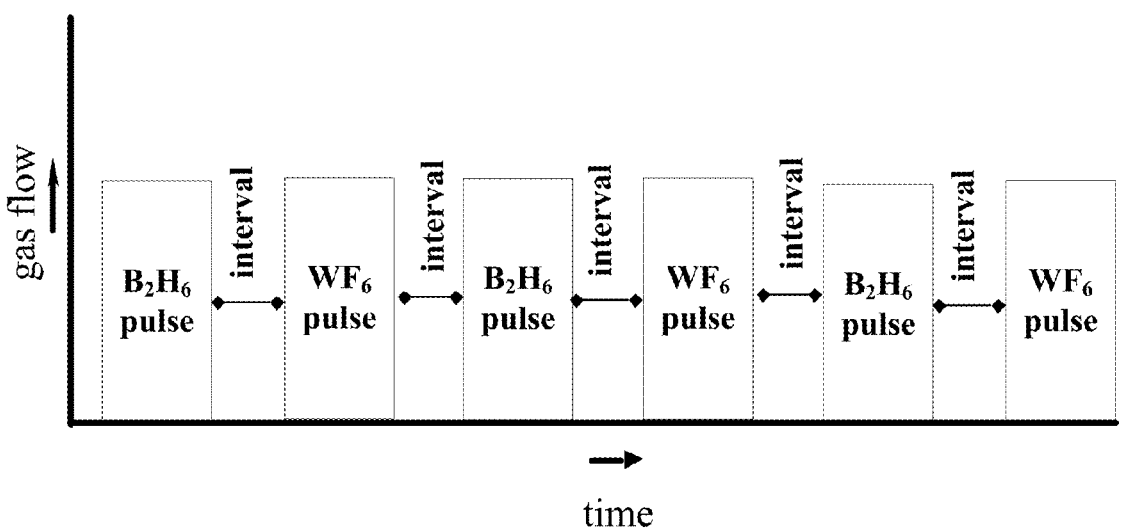

Referring back to FIG. 10, after the tungsten nucleation layer is deposited, the deposited nucleation layer is treated via low temperature multi-pulse treatment to lower resistivity (1006). FIGS. 14a and 14b are graphs showing examples of pulse sequences that may be used according to various embodiments of the low resistivity treatment. FIG. 14a shows an example of a pulse sequence such as described in U.S. Patent Publication No. 2009/0149022, incorporated by reference herein. The treatment process described therein involves exposing the deposited nucleation layer to multiple pulses of a reducing agent (without intervening pulses of another reactive compound). In FIG. 14a, diborane is depicted as the reducing agent, though other reducing agents may be used. The treatment lowers resistivity, while providing good adhesion and resistance non-uniformity. Notably, using multiple reducing agent pulses is shown to provide significantly improved resistivity and uniformity than using a single pulse—even with the same overall exposure time. However, too many pulses may lead to poor adhesion of the eventual tungsten film to the underlying layer. An optimal number of pulses, e.g., between 2-8 is used to obtain low resistivity, low non-uniformity and acceptable adhesion. Unlike the nucleation layer deposition described in FIG. 13, the treatment operation may be performed with hydrogen in the background. Thus, transitioning from the nucleation to the treatment operation may involve turning on a flow of hydrogen in certain embodiments. Also in certain embodiments, a nucleation layer is deposited in a first station of a multi-station deposition chamber, with the low resistivity treatment performed in a second station. Transitioning from the nucleation deposition to the low resistivity treatment involves transferring the substrate to the second station.

FIG. 14b shows another example of a pulse sequence in which the nucleation layer is exposed to multiple cycles of alternating reducing agent and a tungsten-containing precursor pulses. Diborane, $B_2H_6$, and tungsten hexafluoride, $WF_6$, are shown as the reducing agent and tungsten-containing precursor, respectively, though certain embodiments may use other compounds. Alternating pulses of a reducing agent and tungsten-containing precursor are also used to deposit the tungsten nucleation layer, but in the treatment operation, typically substantially no tungsten is deposited. The flow rate and/or pulse time of the tungsten-containing precursor is limited to only scavenge the excess boron on the surface and in the chamber from the low-resistivity treatment, reducing the boron impurity. This in turn results in less micro-peeling and better film adhesion in certain embodiments. Accordingly, tungsten-containing precursor pulse exposure time and/or flow rate (relative to the reducing agent pulse) during the treatment may be less than that used to deposit the nucleation layer.

Some combination of the pulse sequences shown in FIGS. 14a and 14b may also be performed in certain embodiments. In the embodiments described herein, the multi-pulse treatment operation is performed at a reduced temperature (1006), below about 350° C., for example between about 250° C. and 350° C. or 250° C. and 325° C. In certain embodiments, the temperature is around 300° C. As shown above in FIG. 9 and discussed further below, for thin films, performing the low-resistivity treatment at low temperatures unexpectedly provides better resistivity than performing the treatment at higher temperatures. Without being bound by any particular theory, it is believed that this may be due to the amount of boron seen by the substrate. This is discussed further below with reference to FIG. 16A. According to various embodiments, the total amount of diborane (or other boron-containing reducing agent) exposure may be between about 1E-5 to 1E-2 moles, or more particularly, from about 1E-4 to 1E-3 moles during the multi-pulse treatment. A CVD bulk layer is then deposited to fill the feature (1008). This may involve reduced temperature fill, high temperature fill, or in some embodiments, a combination of both.

FIG. 11 shows a process flow sheet in a method of filling features with low resistivity tungsten according to certain embodiments in which reduced temperature CVD is used to partially fill the feature after the nucleation layer is deposited. High temperature CVD is then performed to complete the feature fill. A substrate having a high aspect ratio and/or narrow opening is provided as described with respect to FIG. 10 (1102). A nucleation layer is then deposited in the feature (1104). As described above, in certain embodiments, the nucleation layer is deposited as described in FIG. 13, with alternating diborane and tungsten precursor pulses in a low-temperature hydrogen-free environment. A multi-pulse low resistivity treatment is then optionally performed (1106). This treatment may involve multiple reducing agent pulses, without pulsing an intervening tungsten-precursor (as shown in FIG. 14a) or may involve multiple reducing agent/tungsten precursor pulses (as shown in FIG. 14b) or some combination of these. According to various embodiments, the multi-pulse treatment involves heating the substrate to a temperature between about 350° C. to 450° C., e.g., about 395° C., and allowing the temperature to stabilize, and exposing the nucleation layer, while maintaining the substrate temperature, to the multiple pulses. In other embodiments, the multi-pulse treatment is performed at a lower temperature, as described above with respect to FIG. 10.

Next, the feature is partially filled with a reduced temperature CVD bulk layer (1108). Various tungsten-containing gases including, but not limited to, $WF_6$, $WCl_6$, and $W(CO)_6$ can be used as the tungsten-containing precursor. In certain embodiments, the tungsten-containing precursor is a halogen-containing compound, such as $WF_6$. In certain embodiments, the reducing agent is hydrogen gas, though other reducing agents may be used including silane, disilane, hydrazine, diborane, and germane. In many embodiments, hydrogen gas is used as the reducing agent in the CVD process.

According to various embodiments, the reduced temperature (process and/or substrate temperature) is in one of the following ranges: between about 250-350° C., between about 250° C.-340° C., between about 250° C.-330° C., between about 250° C.-325° C., between about 250° C.-320° C., between about 250° C.-315° C., between about 250° C.-310° C., between about 250° C.-305° C., or between about 250° C.-300° C. Also according to various embodiments, the process temperature is: between about 260-310° C., between about 270° C.-310° C., between about 280° C.-310° C., or between about 290° C.-310° C. In certain embodiments, the process and/or substrate temperature is about 300° C.

Fill is completed via a high temperature CVD deposition (1110). The high temperature may be in one of the following ranges: between about 350-450° C., between about 360° C.-450° C., between about 370° C.-450° C., between about 380° C.-450° C., between about 390° C.-450° C., or between about 400° C.-450° C. In certain embodiments, the high temperature CVD is performed at about 395° C. Raising the temperature may involve raising the substrate temperature.

According to various embodiments, the temperature is raised at least about 25° C., 30° C., 50° C., at least about 60° C., at least about 70° C., at least about 80° C., at least about 90° C., at least about 100° C., at least about 110° C., or at least about 125° C. In one process example, a low temperature CVD operation is performed at about 250° C. and a high temperature at 350° C. In certain embodiments, the temperature is raised no more than about 150° C. or even 125° C. to prevent thermal shock and consequent wafer breakage.

In certain embodiments, transitioning from operation 1108 to operation 1110 involves moving the substrate from one deposition station to another in a multi-station chamber. In alternative embodiments in which a single station is used to perform operations, transitioning from operation 1108 to operation 1110 may involve shutting off a flow of tungsten precursor (optionally allowing hydrogen or other reducing gas and/or carrier gas to run), while raising the substrate temperature. Once the substrate temperature is stabilized, the tungsten precursor and other gases, if necessary, are flowed into the reaction chamber for the high temperature deposition. In other embodiments, transitioning from operation 1210 may involve raising the substrate temperature while allowing the deposition to continue during the transition period.

Figure 15:
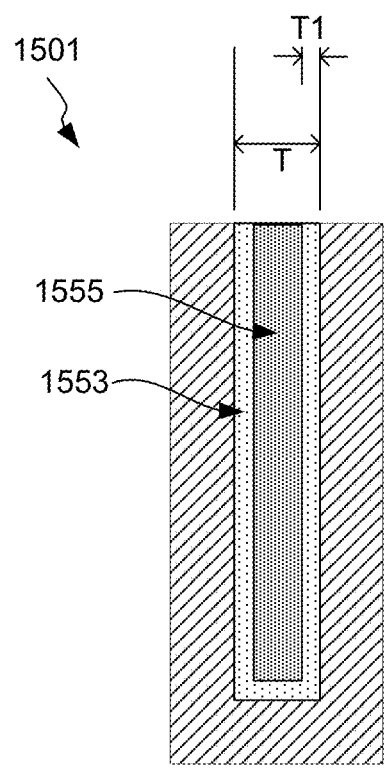
FIG. 15 is a schematic illustration of a feature cross-section after a feature filling process according to certain embodiments.

According to various embodiments, reduced temperature CVD may be used to deposit about 0-70% of the total thickness of the bulk CVD fill. FIG. 15 illustrates a schematic representation of one example of a feature's cross-section after partial reduced temperature CVD fill and completed fill via high temperature CVD. Cross-section 1501 shows conformal partial fill reduced temperature CVD layer 1553 and high temperature fill 1555. T, the total thickness of the deposited CVD layer, is indicated (T is the width of the feature fill minus the tungsten nucleation layer thickness). 2T1 is the total thickness deposited via reduced temperature CVD. In certain embodiments, reduced temperature CVD may be used to deposit about 30-80% or 30-60% of the total thickness of the bulk CVD fill. The reduced temperature layer may also be characterized in terms of thickness deposited, with T1 being between about 1-10 nm or about 2-8 nm.

As discussed further below, partially filling the gap with reduced temperature CVD prior to completing gap fill with high temperature CVD improves resistivity. While the reduced temperature CVD operation generally deposits some amount of conformal tungsten in the feature, it may also be thought of as a low resistivity treatment operation. In certain embodiments, the exposure time and/or dose of the reduced temperature operation may be short or small enough such that substantially no tungsten is deposited.

FIG. 12 presents a process flow diagram in which both a low temperature multi-pulse treatment is performed as well as a partial fill via reduced temperature CVD prior to completing fill via high temperature CVD. As with in reference to FIGS. 10 and 11, a substrate having a high aspect ratio feature is provided (1202), and a nucleation layer is deposited in the feature (1204). Depositing a nucleation layer according to certain embodiments is described in FIG. 13. A low-temperature multiple pulse treatment is then performed (1206) as described above with respect to FIG. 10. At this juncture, in certain embodiments, both the nucleation layer formation and subsequent multi-pulse treatment operation involve the use of a boron-containing compound exclusively as a reducing agent; that is, silanes or other non-boron-containing reducing agents are not used in any operation preceding CVD deposition. Partial fill via reduced temperature CVD is then performed (1208), followed by completing fill using high temperature CVD (1210) as described above with respect to FIG. 11.

Figure 16A:
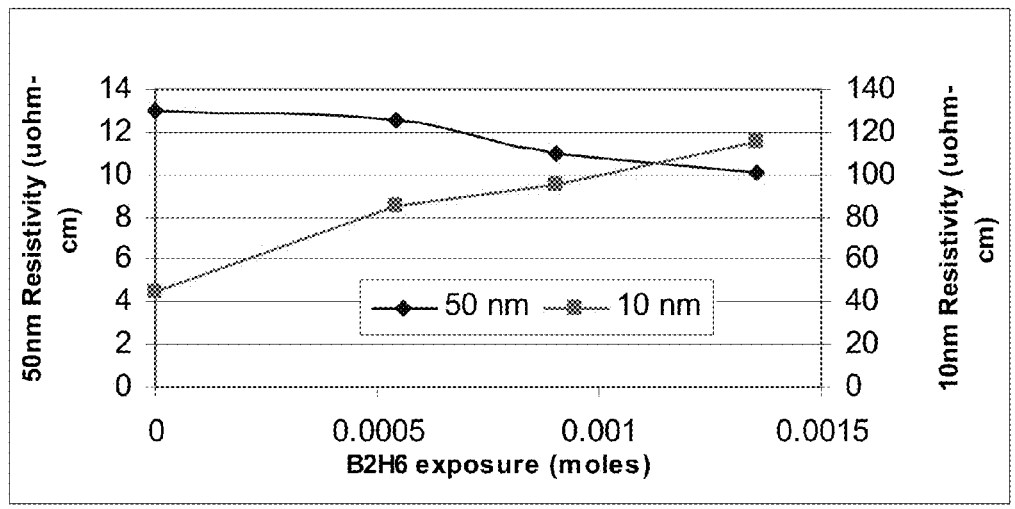
FIG. 16A is a plot illustrating resistivity of 50 nm and 10 nm films as a function of reducing agent exposure during a low resistivity treatment process.

In certain embodiments, the processes described herein involve exposing a deposited tungsten nucleation layer to multiple, sequential pulses of diborane or other boron-containing reducing agent. See, e.g., the above discussion with respect to FIG. 10. FIG. 16A plots resistivity of blanket tungsten films as a function of total diborane exposure (in moles) during a low-temperature multi-pulse treatment process on nucleation layers. Nucleation layer were dosed with diborane as shown, followed by CVD to deposit 50 nm or 10 nm blanket films. 50 nm tungsten film resistivity decreases with increased dose time. Unexpectedly, for the thin 10 nm film, resistivity increases with increased dose time. In certain embodiments, with thin films of about 20 nm or less, the multi-pulse treatment is not performed, or the diborane exposure is maintained at no more than about 1E-5 to 1E-3 moles total exposure.

Figure 16B:
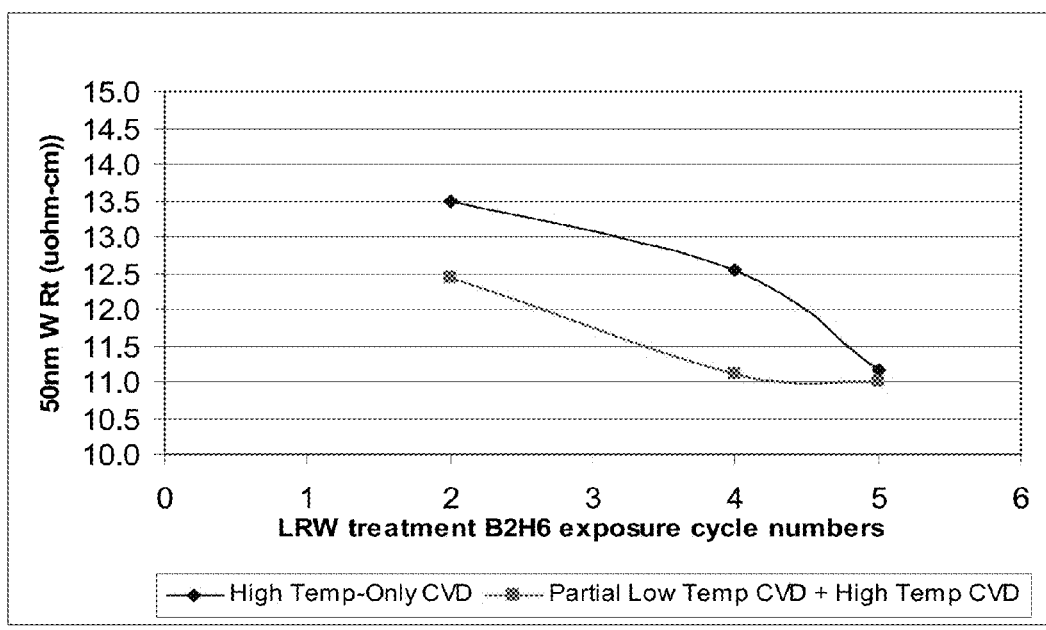
FIG. 16B is a plot illustrating resistivity of a 50 nm film as a function of reducing agent exposure for a low resistivity treatment for features filled via high temperature CVD only and features filled via low and high temperature CVD.

As indicated above, partial fill of a feature using reduced temperature CVD improves resistivity. FIG. 16B plots resistivity of 50 nm blanket films deposited with partial reduced temperature (300° C.) CVD and high temperature-only (395° C.) CVD as a function of multi-pulse low resistivity tungsten (LRW) diborane pulses. The process shown in FIG. 13 was used to deposit the nucleation layer, followed by a multi-pulse treatment as represented in FIG. 14a at 395° C. The partial reduced temperature CVD film is 6 nm, with the remainder of the film thickness deposited by high temperature CVD. Resistivities of both films decrease with an increased number of cycles of the multi-pulse treatment. However, the films with a thin reduced temperature CVD film deposited after the treatment have a lower resistivity that those films with high temperature-only CVD films. As shown, for thick films (e.g., >40 nm), the reduced temperature CVD partial fill improves resistivity. In certain embodiments, the reduced temperature CVD achieves low resistivity with a lower number of diborane pulses.

Figure 17:
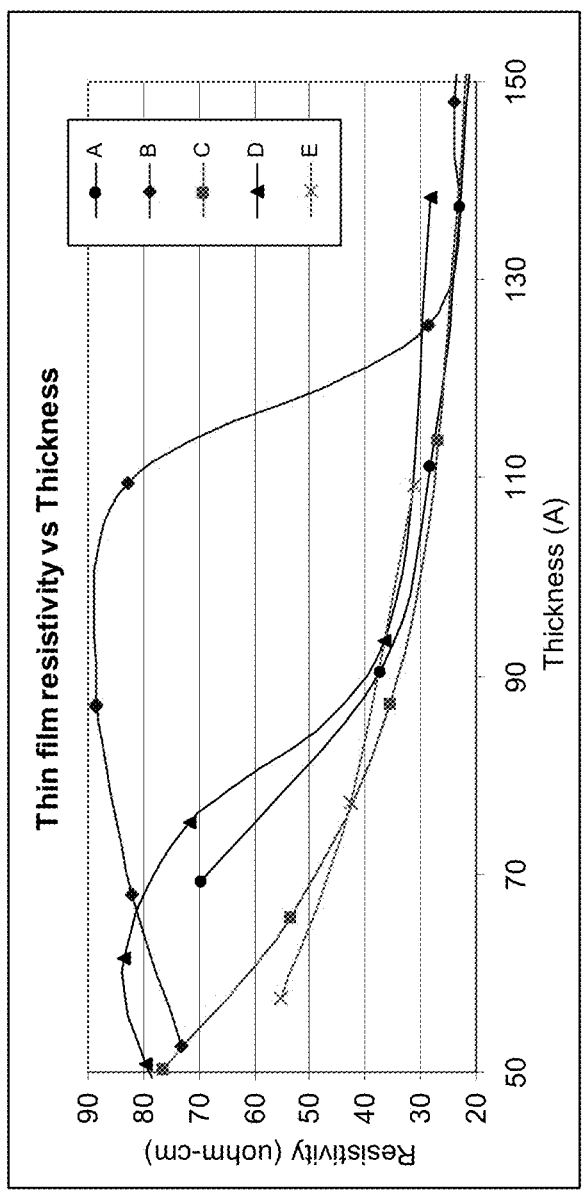
FIG. 17 is a plot illustrating resistivity as a function of film thickness for various fill processes.

FIG. 17 shows film resistivity plotted against film thickness for the processes as described above in reference to FIGS. 10-12. For all films, a nucleation layer of about 2 nm was deposited with the nucleation layer sequence was 5×($B_2H_6$/$WF_6$) ($H_2$-free ambient) at 300° C. Processes used to deposit the blanket films are shown below:

| Process | Low resistivity treatment pulse sequence | Low resistivity treatment temperature | CVD chemistry | CVD temperature |
|---------|------------------------------------------|---------------------------------------|---------------|-----------------|
| A | 6 × ($B_2H_6$) | 395° C. | $WF_6$ and $H_2$ | 395° C. (only) |
| B | 6 × ($B_2H_6$) | 395° C. | $WF_6$ and $H_2$ | 300° C. (only) |
| C (FIG. 12) | 6 × ($B_2H_6$) | 300° C. | $WF_6$ and $H_2$ | 300° C. (partial thickness - about 30 Å or 3 nm for each film) 395° C. (remaining thickness) |
| D | 6 × ($B_2H_6$) | 300° C. | $WF_6$ and $H_2$ | 300° C. (only) |
| E | 6 × ($B_2H_6$) | 300° C. | $WF_6$ and $H_2$ | 395° C. (only) |

Between 8 and 15 nm, process C (a low temperature multi-pulse treatment and partial reduced temperature CVD) resulted in the lowest resistivity. Unexpectedly, partial reduced temperature CVD (process C) results in lower resistivity than reduced temperature-only CVD (process D) and high-temperature only CVD (process E) for identical nucleation and treatment processes for films of about 7.5 nm and above.

Comparing process A to process E, low temperature low resistivity treatment results in lower resistivity for films less than about 9 nm thick. However, for reduced temperature-only CVD, as discussed above with respect to FIG. 9, the high temperature low-resistivity treatment (process B) results in higher resistivity than the low temperature low-resistivity process (process D) for almost all film thicknesses below about 120 nm.

Figure 18:
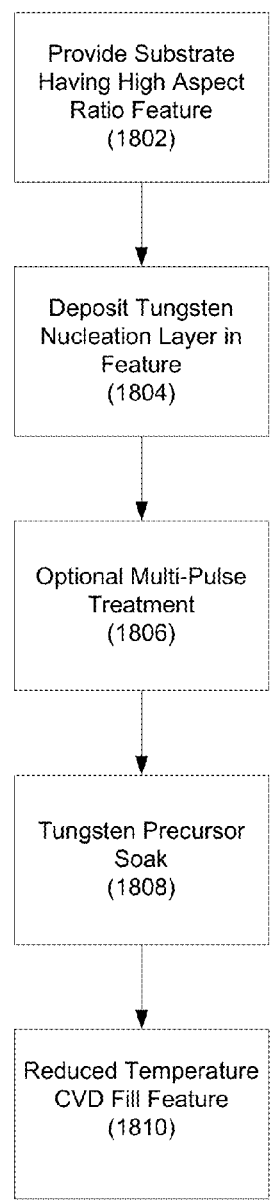
FIG. 18 is a process flow diagram illustrating operations in a method of filling a feature with tungsten according to various embodiments.

In certain embodiments, reduced temperature CVD is preceded by a tungsten-precursor soak operation to lower resistivity. FIG. 18 presents a process flow illustrating operations in such a process. First, a substrate having a high aspect ratio feature is provided (1802). As with all the processes described herein, this process may also be employed with other feature geometries. Then, a tungsten nucleation layer is deposited in the feature by any appropriate method (1804), followed by a multi-pulse treatment (1806) as described above with reference to FIGS. 14A and 14B. At this point, the substrate is exposed to the tungsten-precursor, without the presence of reducing agent, in a tungsten-precursor soak operation (1808). Soak time may be between about 0.5 seconds to 10 seconds, e.g., about 1-5 seconds. Temperature during the soak operation may be the same temperature as the subsequent reduced temperature CVD, e.g., 300° C. After the tungsten-precursor soak, the feature is then filled with reduced temperature CVD tungsten film (1810). In alternative embodiments, the tungsten-precursor soak may be performed prior to partial fill reduced temperature CVD.

Figure 19:
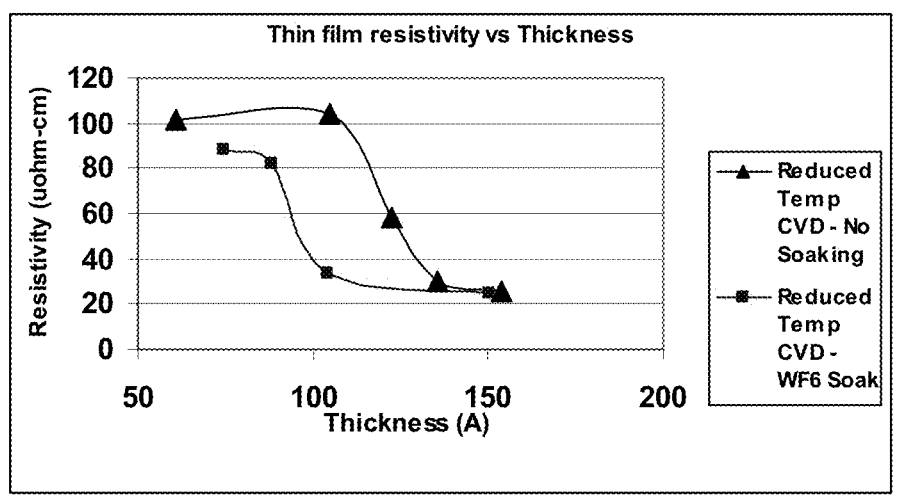
FIG. 19 is a plot illustrating resistivity as a function of film thickness for various fill processes.

FIG. 19 is a plot of thin film resistivity as function of film thickness for films deposited by reduced temperature CVD with and without a $WF_6$ soak. For all films, a nucleation layer was deposited using the process shown in FIG. 13, followed by a multi-pulse diborane low resistivity treatment. For films between about 8-12 nm, soaking achieves lower resistivity than the process without soaking. In certain embodiments, the process described in FIG. 18 is used to achieve low resistivity with the high quality plugfill described above with reference to FIG. 3.

Apparatus

The methods of the invention may be carried out in various types of deposition apparatus available from various vendors. Examples of suitable apparatus include a Novellus Concept-1 Altus™, a Concept 2 Altus™, a Concept-2 ALTUS-S™, Concept 3 Altus™ deposition system, and Altus Max™ or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, a nucleation layer is deposited, e.g., by a pulsed nucleation process at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

A second station may then be used to complete nucleation layer deposition or to perform a multi-pulse low resistivity treatment. In certain embodiments, a single pulse low resistivity treatment may be performed.

One or more stations are then used to perform CVD as described above. Two or more stations may be used to perform CVD in a parallel processing. Alternatively a wafer may be indexed to have the CVD operations performed over two or more stations sequentially. For example, in processes involving both low temperature and high temperature CVD operations, a wafer or other substrate is indexed from one CVD station to another for each operation.

Figure 20:
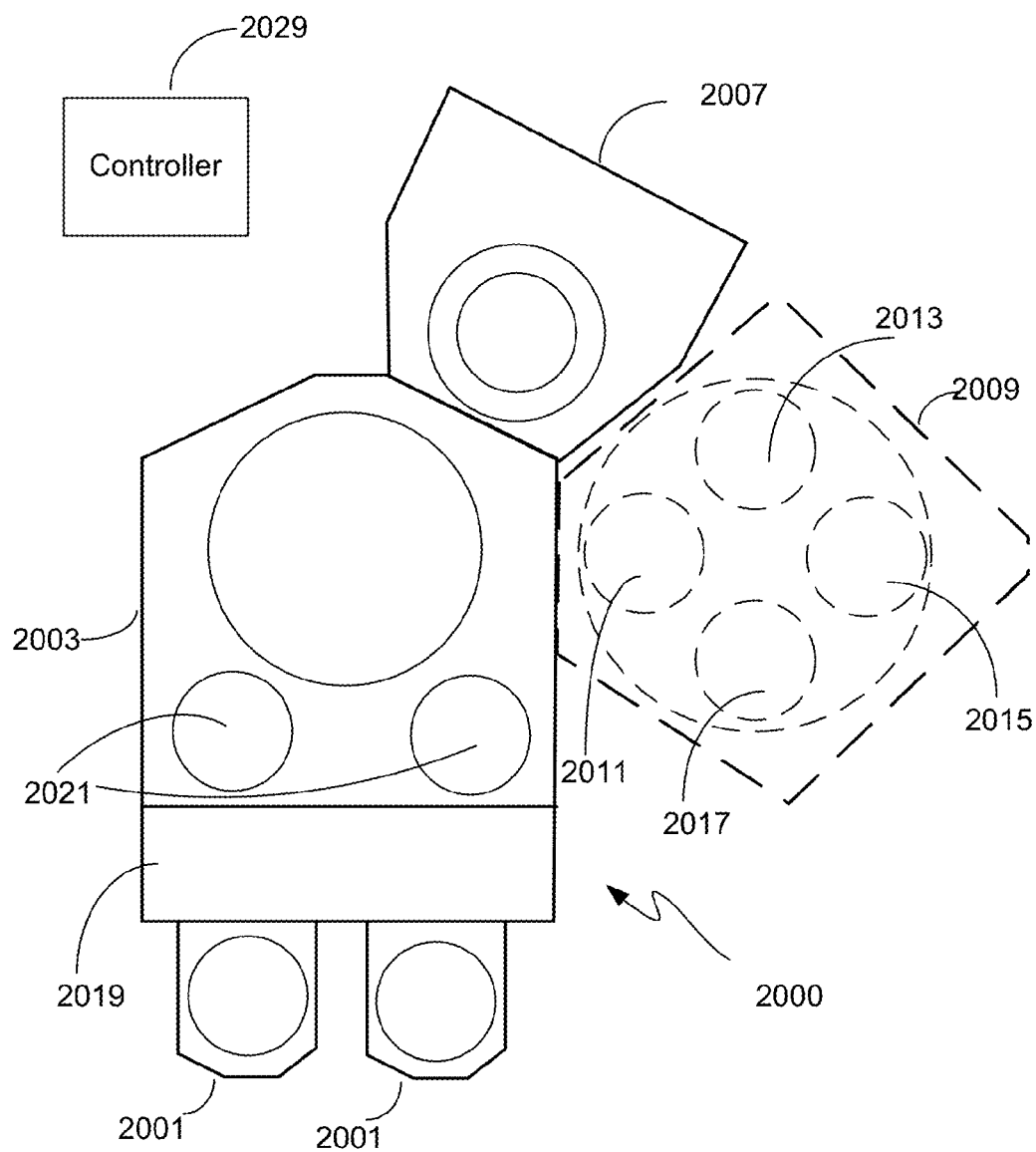
FIG. 20 is a schematic illustration of a processing system suitable for conducting tungsten deposition process in accordance with embodiments of the invention.
Figure 21:
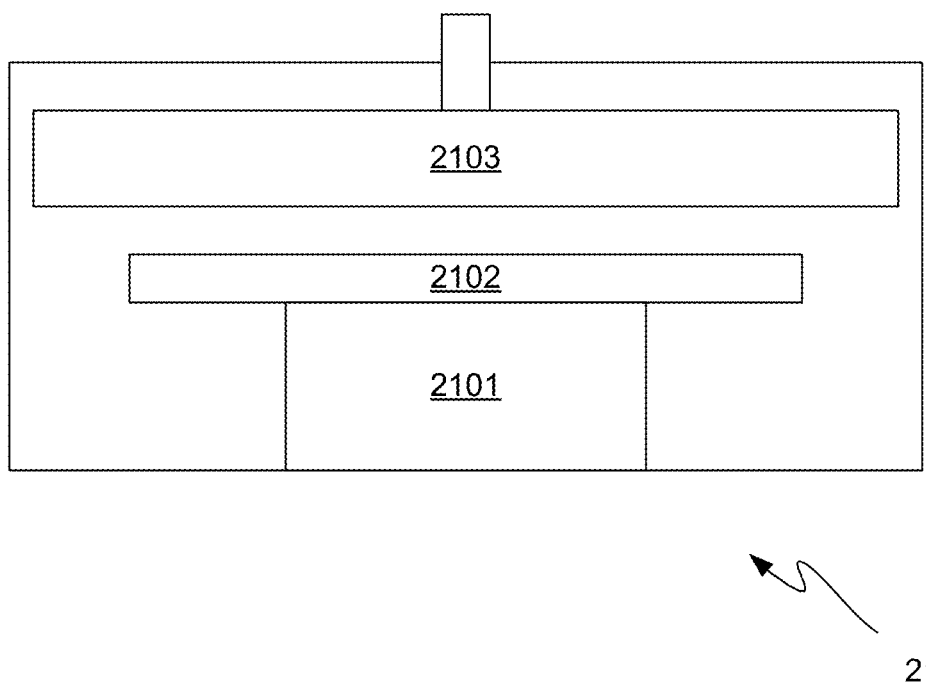
FIG. 21 is a basis illustration of a tungsten deposition in accordance with embodiments of the invention.

FIG. 20 is a block diagram of a processing system suitable for conducting tungsten thin film deposition processes in accordance with embodiments of the invention. The system 2000 includes a transfer module 2003. The transfer module 2003 provides a clean, pressurized environment to minimize the risk of contamination of substrates being processed as they are moved between the various reactor modules. Mounted on the transfer module 2003 is a multi-station reactor 2009 capable of performing PNL deposition, multi-pulse treatment if desired, and CVD according to embodiments of the invention. Chamber 2009 may include multiple stations 2011, 2013, 2015, and 2017 that may sequentially perform these operations. For example, chamber 2009 could be configured such that station 2011 performs PNL deposition, station 2013 performs multi-pulse treatment, and stations 2015 and 2017 perform CVD. Each deposition station includes a heated wafer pedestal and a showerhead, dispersion plate or other gas inlet. An example of a deposition station 2100 is depicted in FIG. 21, including wafer support 2102 and showerhead 2103. A heater may be provided in pedestal portion 2101.

Also mounted on the transfer module 2003 may be one or more single or multi-station modules 2007 capable of performing plasma or chemical (non-plasma) pre-cleans. The module may also be used for various other treatments, e.g., post liner tungsten nitride treatments. The system 2000 also includes one or more (in this case two) wafer source modules 2001 where wafers are stored before and after processing. An atmospheric robot (not shown) in the atmospheric transfer chamber 2019 first removes wafers from the source modules 2001 to loadlocks 2021. A wafer transfer device (generally a robot arm unit) in the transfer module 2003 moves the wafers from loadlocks 2021 to and among the modules mounted on the transfer module 2003.

In certain embodiments, a system controller 2029 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of embodiments of the invention in a single or multi-chamber semiconductor processing tool.

Applications

The present invention may be used to deposit thin, low resistivity tungsten layers for many different applications. One application is vias, contacts and other tungsten structures commonly found in electronic devices. Another application are interconnects in integrated circuits such as memory chips and microprocessors. Interconnects are current lines found on a single metallization layer and are generally long thin flat structures. A primary example of an interconnect application is a bit line in a memory chip. In general, the invention finds application in any environment where thin, low-resistivity tungsten layers are required.

Other Embodiments

While this invention has been described in terms of several embodiments, there are alterations, modifications, permutations, and substitute equivalents, which fall within the scope of this invention. For example, while the above description is chiefly in the context of feature fill, the methods described above may also be used to deposit low resistivity tungsten films on blanket surfaces. These may be formed by a blanket deposition of a tungsten layer (by a process as described above), followed by a patterning operation that defines the location of current carrying tungsten lines and removal of the tungsten from regions outside the tungsten lines.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of filling a recessed feature on a substrate, the method comprising:
   providing a substrate having a field region and a first feature recessed from the field region, said recessed feature comprising sidewalls, a bottom, an opening, corners, and a Ti/TiN liner layer;
   depositing a tungsten nucleation layer on the sidewalls and bottom of the recessed feature; and
   filling the feature with a low temperature CVD tungsten bulk layer via a chemical vapor deposition (CVD) process; wherein the substrate temperature during the CVD process is maintained at between 250° C. and 350° C.

2. The method of claim 1 wherein the first recessed feature has an aspect ratio of at least 10:1.

3. The method of claim 1 wherein the first recessed feature has an aspect ratio of at least 20:1.

4. The method of claim 1 wherein width of the first recessed feature opening is no more than about 100 nm.

5. The method of claim 1 wherein width of the first recessed feature opening is no more than about 50 nm.

6. The method of claim 1 wherein the width of the first recessed feature opening is no more than about 40 nm.

7. The method of claim 1 wherein filling the first recessed feature comprises covering the feature corners with the low temperature CVD bulk layer.

8. The method of claim 1 wherein the substrate further comprises a second feature recessed from the field region, said second recessed feature having an aspect ratio lower than that of the first feature.

9. The method of claim 1 wherein filling the feature with a low temperature CVD tungsten bulk layer comprises introducing a halogenated tungsten-containing precursor and a reducing agent into a reaction station housing the substrate.

10. The method of claim 9 wherein the halogenated tungsten-containing precursor is tungsten hexafluoride.

11. The method of claim 1 wherein the liner layer has a thickness of no more than 5 nm.

12. The method of claim 1 further comprising, after depositing a tungsten nucleation layer on the sidewalls and bottom of the recessed feature and prior to filling the feature with a low temperature CVD tungsten bulk layer, soaking the substrate with a tungsten-precursor.

13. The method of claim 1 wherein substrate temperature during the CVD process is maintained at between 250° C. and 325° C.

14. A method of filling a recessed feature on a substrate, the method comprising:
   providing a substrate having a field region and a first feature recessed from the field region, said recessed feature comprising sidewalls, a bottom, an opening, and corners;
   depositing a tungsten nucleation layer on the sidewalls and bottom of the recessed feature; and
   filling the feature with a low temperature CVD tungsten bulk layer via a chemical vapor deposition (CVD) process; wherein the substrate temperature during the CVD process is maintained at between 250° C. and 350° C., further comprising after filling the first recessed feature, raising the substrate temperature at least 50° C. and, after raising the substrate temperature, depositing a high temperature bulk tungsten CVD layer on the filled first recessed feature.

15. The method of claim 14 wherein the feature comprises a liner layer.

16. The method of claim 15 wherein the liner layer is a Ti/TiN layer.

17. A method of filling a recessed feature on a substrate, the method comprising:
   providing a substrate having a field region, a first feature recessed from the field region, said recessed feature comprising sidewalls, a bottom, an opening, and corners, and a second feature recessed from the field region, said second recessed feature having an aspect ratio lower than that of the first feature;
   depositing a tungsten nucleation layer on the sidewalls and bottom of the recessed feature;
   filling the feature with a low temperature CVD tungsten bulk layer via a chemical vapor deposition (CVD) process; wherein the substrate temperature during the CVD process is maintained at between 250° C. and 350° C.; and after filling the first recessed feature, raising the substrate temperature at least 50° C. and, after raising the substrate temperature, depositing a high temperature bulk tungsten CVD layer to fill the second recessed feature.

* * * * *